United States Patent
Dimond

(10) Patent No.: US 8,739,101 B1
(45) Date of Patent: May 27, 2014

(54) SYSTEMS AND METHODS FOR REDUCING LOGIC SWITCHING NOISE IN PARALLEL PIPELINED HARDWARE

(71) Applicant: Maxeler Technologies Ltd., London (GB)

(72) Inventor: Robert Gwilym Dimond, London (GB)

(73) Assignee: Maxeler Technologies Ltd., London (GB)

( * ) Notice: Subject to any disclaimer, the term of this patent is extended or adjusted under 35 U.S.C. 154(b) by 0 days.

(21) Appl. No.: 13/683,743

(22) Filed: Nov. 21, 2012

(51) Int. Cl.
| | | |
|---|---|---|
| G06F 17/50 | (2006.01) | |
| G06F 9/44 | (2006.01) | |
| G06F 7/38 | (2006.01) | |
| G06F 7/32 | (2006.01) | |
| G06F 9/445 | (2006.01) | |
| G06F 9/455 | (2006.01) | |
| G06F 9/38 | (2006.01) | |

(52) U.S. Cl.
CPC ........ *G06F 17/5054* (2013.01); *G06F 17/5077* (2013.01); *G06F 9/445* (2013.01); *G06F 9/455* (2013.01); *G06F 9/382* (2013.01); *G06F 9/4403* (2013.01); *G06F 9/44505* (2013.01); *G06F 2009/4441* (2013.01); *G06F 7/38* (2013.01); *G06F 7/32* (2013.01)
USPC ........... 716/116; 716/121; 716/124; 716/125; 716/128; 716/129; 716/130; 716/131; 716/132; 703/16; 703/20; 708/233; 708/521

(58) Field of Classification Search
CPC . G06F 17/5054; G06F 17/5077; G06F 9/445; G06F 9/455; G06F 9/382; G06F 9/4403; G06F 9/44505; G06F 9/4455; G06F 7/38; G06F 7/32; G06F 2009/4441; G06F 2009/38
USPC ......... 716/116, 121, 124, 125, 128, 129, 130, 716/131, 132; 703/16, 20; 708/233, 521
See application file for complete search history.

(56) References Cited

U.S. PATENT DOCUMENTS

| | | | | | |
|---|---|---|---|---|---|
| 5,164,724 | A | * | 11/1992 | Hartley et al. | 341/95 |
| 5,228,138 | A | * | 7/1993 | Pratt et al. | 713/401 |
| 5,761,484 | A | * | 6/1998 | Agarwal et al. | 326/38 |

(Continued)

OTHER PUBLICATIONS

Udupa et al. "Software Pipelined Execution of Stream Programs on GPUs", IEEE 2009 International Symposium on Code Generation and Optimization, 2009, pp. 200-209.*

(Continued)

*Primary Examiner* — Phallaka Kik
(74) *Attorney, Agent, or Firm* — Conley Rose, P.C.

(57) ABSTRACT

A method of configuring a hardware design for a pipelined parallel stream processor includes obtaining a scheduled graph representing a processing operation in the time domain as a function of clock cycles. The graph includes a data path to be implemented in hardware as part of the stream processor, an input, an output, and parallel branches to enable data values to be streamed therethrough from the input to the output as a function of increasing clock cycle. The data path is partitioned into a plurality of discrete regions, each region operating on a different clock phase and having discrete control logic elements. Phase transition registers to align data separated by a boundary between regions having different clock phases are introduced into the data path at the boundary. The graph and control logic elements define a hardware design for the pipelined parallel stream processor.

29 Claims, 15 Drawing Sheets

(56) References Cited

U.S. PATENT DOCUMENTS

| | | | |
|---|---|---|---|
| 6,029,220 A * | 2/2000 | Iwamura et al. | 712/32 |
| 6,651,232 B1 * | 11/2003 | Pileggi et al. | 716/114 |
| 6,826,569 B2 * | 11/2004 | Robertson | 1/1 |
| 7,128,270 B2 * | 10/2006 | Silverbrook et al. | 235/472.01 |
| 7,676,661 B1 * | 3/2010 | Mohan et al. | 712/225 |
| 7,724,028 B1 * | 5/2010 | Ansari et al. | 326/38 |
| 7,805,697 B2 * | 9/2010 | Wood | 716/113 |
| 7,827,510 B1 * | 11/2010 | Schubert et al. | 716/136 |
| 7,913,203 B1 * | 3/2011 | Perry | 716/104 |
| 7,954,114 B2 * | 5/2011 | Chamberlain et al. | 719/320 |
| 8,035,435 B1 * | 10/2011 | Shringarpure et al. | 327/167 |
| 8,181,003 B2 * | 5/2012 | Wang et al. | 712/225 |
| 8,250,507 B1 * | 8/2012 | Agarwal et al. | 716/110 |
| 8,281,265 B2 * | 10/2012 | Vorbach et al. | 716/100 |
| 8,487,655 B1 * | 7/2013 | Kutz et al. | 326/86 |
| 2003/0121010 A1 * | 6/2003 | Aubury | 716/4 |
| 2004/0123258 A1 * | 6/2004 | Butts | 716/5 |
| 2005/0251775 A1 * | 11/2005 | Wood | 716/10 |
| 2006/0107244 A1 * | 5/2006 | Yonezawa | 716/4 |
| 2006/0158268 A1 * | 7/2006 | McCorquodale et al. | 331/34 |
| 2006/0225002 A1 * | 10/2006 | Hassoun et al. | 716/1 |
| 2006/0259889 A1 * | 11/2006 | Crosetto | 716/10 |
| 2011/0314432 A1 * | 12/2011 | Cross et al. | 716/102 |
| 2012/0240091 A1 * | 9/2012 | Sunder et al. | 716/113 |

OTHER PUBLICATIONS

Wohl et al., "MIMD Implementation of Neural Networks through Pipelined, Parallel Communication Trees", Proceeding of the 1991 IEEE International Conference on Tools for AI, Nov. 1991, pp. 82-89.*

Zhuo et al., "High-Performance Reduction Circuits Using Deeply Pipelined Operators on FPGAs", IEEE Transactions on Parallel and Distributed Systems, vol. 18, No. 10, Oct. 2007, pp. 1377-1392.*

* cited by examiner

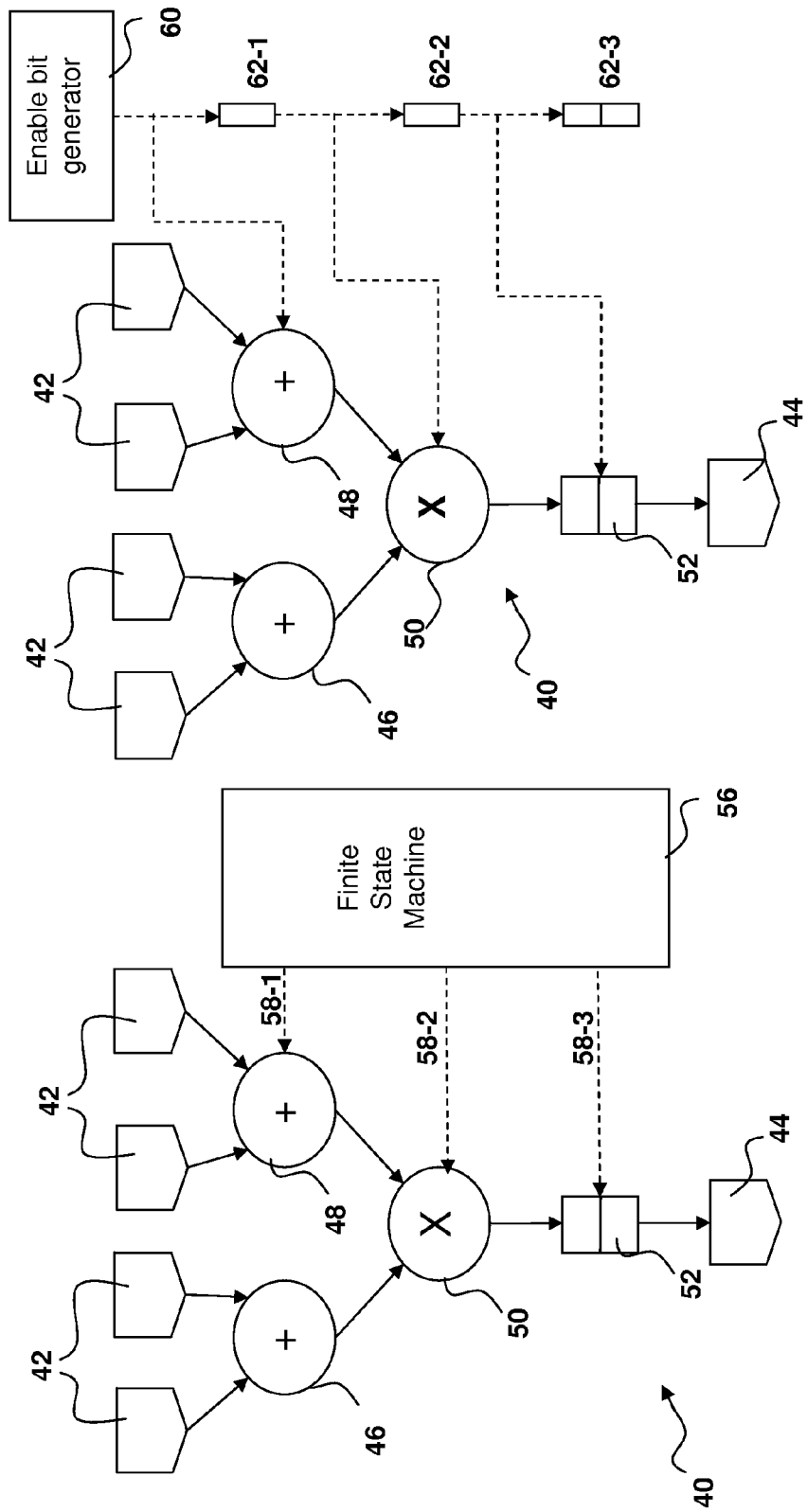

SYSTEMS AND METHODS FOR REDUCING LOGIC SWITCHING NOISE IN PARALLEL PIPELINED HARDWARE

CROSS-REFERENCE TO RELATED APPLICATIONS

None.

BACKGROUND

Computer systems are often used to implement computational models of a particular physical system, region or event. Commonly, such computational models require iterative numerical calculations to be solved for a large number of data areas or data points. This requires an extremely large number of calculations to be performed; consuming large amounts of computational resources and requiring a significant time period to perform complete the necessary calculations.

Commonly, a processor such as a central processing unit (CPU) is used in computing systems. Traditionally, the performance of a computing system has been increased by increasing the operating frequency of the CPU (i.e. by increasing the number of operations the CPU can carry out per second) and by reducing the size of the individual transistors on the CPU so that more transistors can be accommodated per unit area.

An alternative approach to increase the speed of a computer system for specialist computing applications is to use additional or specialist hardware accelerators. These hardware accelerators increase the computing power available and concomitantly reduce the time required to perform the calculations. In certain cases, a specialist hardware accelerator may increase the performance of highly parallel applications by over an order of magnitude or more.

One such example of a suitable system is a stream processing accelerator having a dedicated local memory. The accelerator may be located on an add-in card which is connected to the computer via a bus such as Peripheral Component Interconnect Express (PCI-E). The bulk of the numerical calculations can then be handled by the specialized accelerator.

A useful type of stream processor accelerator can be implemented using Field-Programmable Gate Arrays (FPGAs). FPGAs are reprogrammable hardware chips which can implement digital logic. FPGAs comprise no intrinsic functionality and, instead, include a plurality of gates, flip-flops and memory elements which are configurable through use of appropriate software elements.

SUMMARY

According to an embodiment of the present disclosure, there is provided a method of utilizing high level synthesis to configure automatically control logic of a hardware design for a pipelined parallel stream processor, the method comprising: obtaining a scheduled graph representing a processing operation in the time domain as a function of clock cycles, the graph comprising at least one data path to be implemented in hardware as part of said stream processor and comprising at least one input, at least one output and a plurality of parallel branches configured to enable data values to be streamed therethrough from the at least one input to the at least one output as a function of increasing clock cycle; performing, on a computing device, partitioning of said at least one data path to divide said at least one data path into a plurality of discrete regions; assigning, on a computing device, discrete control logic elements to each of said regions of said data path; and utilizing, on a computing device, said graph and control logic assigned during said high level synthesis steps to define a hardware design for implementation in hardware as said pipelined parallel stream processor.

By providing such a method, the optimization of a hardware design for a stream processor can be considered as a global optimization problem in which a scheduled data path is optimized along with control logic. This enables the hardware design, when implemented in hardware as a pipelined parallel stream processor, to utilize fully the available resources of the hardware platform in the most efficient manner to achieve an optimum balance between consumption of hardware resources for control logic and timing speed. In contrast, known arrangements require optimization of control logic to be carried out at the RTL stage when less modification to the data path is possible and the level of complexity of the stream processor design is such to make global optimization of the control logic impractical.

In one embodiment, the data path is represented as comprising a plurality of functional objects each corresponding directly to a hardware element to be implemented in hardware as part of said pipelined parallel stream processor, each functional object being operable to execute a function on said data values propagating through said data path between the at least one input and the at least one output and being connected to other parts of said data path by one or more edge connections.

In one embodiment, said step of performing comprises performing minimum-cut partitioning by: assigning a weight to each edge connection; and partitioning said data path such that the sum of the weights of the edge connections connecting said plurality of discrete regions is minimized.

In one embodiment, the weight of each edge connection is dependent upon the number of bits of data required to be streamed therethrough per cycle.

In one embodiment, said step of performing comprises performing minimum-cut partitioning by: assigning a weight to each functional object; and partitioning said data path such that the sum of the weights of the functional objects within each region is approximately evenly distributed.

In one embodiment, the weight of each functional object is dependent upon the hardware utilization corresponding to said functional object. The weight may comprise, in one embodiment, the fan out of the enable signal for a functional object.

In one embodiment, said minimum-cut partitioning utilizes a simulated annealing algorithm.

In one embodiment, said step of performing further comprises selecting the number of discrete regions said data path is to be divided into.

In one embodiment, the number of regions is in the range of 2 to 128.

In one embodiment, said step of assigning comprises, within one or more regions: grouping functional objects having a cycle position dependent upon common factors; and allocating common control logic to said groups of functional objects.

In one embodiment, the value of said one or more common factors is specified after said optimized hardware design has been implemented in hardware as said pipelined parallel stream processor.

In one embodiment, each control logic element comprises control logic hardware units including a counter and one or more comparators, or a counter and one or more comparators and one or more shift registers having one or more delay elements.

In one embodiment, said step of assigning further comprises, after said step of allocating: for each control logic element, automatically selecting the number of comparators, the number of shift registers and the number of delay elements in the shift register.

In one embodiment, said step of automatically selecting is done to minimize the hardware requirements for each control logic element.

In one embodiment, one or more of said regions operate on different clock phases.

In one embodiment, subsequent to said step of performing, the method further comprises the step of: introducing phase transition registers into said data path at a boundary between regions having different clock phases.

In one embodiment, said phase transition registers are operable to compensate for two half cycles of delay caused by an even number of clock phase transitions in order to align data separated by a boundary between regions.

In one embodiment, subsequent to said step of introducing, the method further comprises: rescheduling said graph to account for said phase transition registers.

In one embodiment, said step of obtaining comprises the steps of: defining, on a computing device, a processing operation designating processes to be implemented in hardware as part of said stream processor; defining, on a computing device, a graph representing said processing operation; and optimizing, on a computing device, the at least one data path in said graph to produce an optimized graph.

In one embodiment, said stream processor is implemented on a Field Programmable Gate Array or an Application Specific Integrated Circuit.

In one embodiment, the method further comprises the step of forming said optimized hardware design on said stream processor such that said stream processor is operable to perform said processing operation.

In one embodiment, the method further comprises: programming the logic device to embody the generated design.

According to an embodiment, there is provided a non-transitory computer-readable medium having stored thereon a computer program executable by a programmable processing apparatus, comprising one or more software portions for performing the steps of embodiments.

According to an embodiment, there is provided a Field Programmable Gate Array, Application Specific Integrated Circuit or other programmable logic device, having a design generated utilizing high level synthesis to carry out the steps of: obtaining a scheduled graph representing a processing operation in the time domain as a function of clock cycles, the graph comprising at least one data path to be implemented in hardware as part of said stream processor and comprising at least one input, at least one output and a plurality of parallel branches configured to enable data values to be streamed therethrough from the at least one input to the at least one output as a function of increasing clock cycle; performing, on a computing device, partitioning of said at least one data path to divide said at least one data path into a plurality of discrete regions; assigning, on a computing device, discrete control logic elements to each of said regions of said data path; and utilizing, on a computing device, said graph and assigned control logic assigned during said high level synthesis stage to define a hardware design for implementation in hardware as said pipelined parallel stream processor.

According to an embodiment, there is provided a system for generating a hardware stream processor design, the system comprising: a processor; and a memory coupled to the processor and storing a program that, when executed by the processor, causes the processor to: obtain a scheduled graph representing a processing operation in the time domain as a function of clock cycles, the graph comprising at least one data path to be implemented in hardware as part of said stream processor and comprising at least one input, at least one output and a plurality of parallel branches configured to enable data values to be streamed therethrough from the at least one input to the at least one output as a function of increasing clock cycle; perform, using high level synthesis, partitioning of said at least one data path to divide said at least one data path into a plurality of discrete regions; assign, using high level synthesis, discrete control logic elements to each of said regions of said data path; and utilize, using high level synthesis, said graph and assigned control logic assigned during said high level synthesis stage to define a hardware design for implementation in hardware as said pipelined parallel stream processor; and generate a list of instructions for the programming of a programmable logic device having the generated design.

According to an embodiment, there is provided a method of utilizing high level synthesis to configure automatically control logic of a hardware design for a pipelined parallel stream processor, the method comprising: obtaining a scheduled graph representing a processing operation in the time domain as a function of clock cycles, the graph comprising at least one data path to be implemented in hardware as part of said stream processor and comprising at least one input, at least one output, a plurality of functional objects and a plurality of parallel branches configured to enable data values to be streamed therethrough from the at least one input to the at least one output as a function of increasing clock cycle; grouping functional objects having a cycle position dependent upon common factors; and allocating common control logic elements to said groups of functional objects; and utilizing, on a computing device, said graph and allocated control logic to define a hardware design for implementation in hardware as said pipelined parallel stream processor.

In one embodiment, each control logic element comprises control logic hardware units including a counter and one or more comparators, or a counter, one or more comparators and one or more shift registers having one or more delay elements.

In one embodiment, after said step of allocating, the method further comprises: for each control logic element, automatically selecting the number of comparators, the number of shift registers and the number of delay elements in the shift register.

In one embodiment, said step of automatically selecting is done to minimize the hardware requirements for each control logic element.

In one embodiment, the value of said one or more common variables is specified after said optimized hardware design has been implemented in hardware as said pipelined parallel stream processor.

In one embodiment, said step of obtaining comprises the steps of: defining, on a computing device, a processing operation designating processes to be implemented in hardware as part of said stream processor; defining, on a computing device, a graph representing said processing operation; and optimizing, on a computing device, the at least one data path in said graph to produce an optimized graph.

In one embodiment, said stream processor is implemented on a Field Programmable Gate Array or an Application Specific Integrated Circuit.

In one embodiment, the method further comprises the step of forming said optimized hardware design on said stream processor such that said stream processor is operable to perform said processing operation.

In one embodiment, the method further comprises; programming a logic device to embody the generated design.

According to an embodiment of the present disclosure, there is provided a non-transitory computer-readable medium having stored thereon a computer program executable by a programmable processing apparatus, comprising one or more software portions for performing the steps of the embodiments.

According to an embodiment, there is provided a Field Programmable Gate Array, Application Specific Integrated Circuit or other programmable logic device, having a design generated utilizing high level synthesis to carry out the steps of: obtaining a scheduled graph representing a processing operation in the time domain as a function of clock cycles, the graph comprising at least one data path to be implemented in hardware as part of said stream processor and comprising at least one input, at least one output, a plurality of functional objects and a plurality of parallel branches configured to enable data values to be streamed therethrough from the at least one input to the at least one output as a function of increasing clock cycle; grouping functional objects having a cycle position dependent upon common factors; and allocating common control logic elements to said groups of functional objects; and utilizing, on a computing device, said graph and control logic allocated during said high level synthesis steps to define a hardware design for implementation in hardware as said pipelined parallel stream processor.

According to an embodiment, there is provided a system for generating a hardware stream processor design, the system comprising: a processor; and a memory coupled to the processor and storing a program that, when executed by the processor, causes the processor to: obtain a scheduled graph representing a processing operation in the time domain as a function of clock cycles, the graph comprising at least one data path to be implemented in hardware as part of said stream processor and comprising at least one input, at least one output, a plurality of functional objects and a plurality of parallel branches configured to enable data values to be streamed therethrough from the at least one input to the at least one output as a function of increasing clock cycle; group, using high level synthesis, functional objects having a cycle position dependent upon common factors; and allocate, using high level synthesis, common control logic elements to the group of functional objects; and utilize said graph and control logic allocated during said high level synthesis steps to define a hardware design for implementation in hardware as said pipelined parallel stream processor; and generate a list of instructions for the programming of a programmable logic device having the generated design.

According to a first aspect of the present disclosure, there is provided a method for configuring a hardware design for a pipelined parallel stream processor, the method comprising: obtaining a scheduled graph representing a processing operation in the time domain as a function of clock cycles, the graph comprising at least one data path to be implemented in hardware as part of said stream processor and comprising at least one input, at least one output and a plurality of parallel branches configured to enable data values to be streamed therethrough from the at least one input to the at least one output as a function of increasing clock cycle; partitioning, on a computing device, said at least one data path into a plurality of discrete regions, each region operating on a different clock phase and having discrete control logic elements; introducing phase transition registers into said data path at a boundary between regions having different clock phases, said phase transition registers being operable to align data separated by a boundary between regions having different clock phases; utilizing, on a computing device, said graph and control logic elements to define a hardware design for implementation in hardware as said pipelined parallel stream processor.

In one embodiment, a graph is partitioned into N regions and said phase transition registers are operable to compensate for X/N cycles of delay (where X<N) as a result of data transitioning between regions.

In one embodiment, said step of partitioning is carried out such that all inputs are within the same region and operate on the same clock phase.

In one embodiment, inserted phase transition registers have an advertised latency of zero.

In one embodiment, the steps of obtaining, partitioning and introducing are carried out utilizing high level synthesis.

In one embodiment, inserted phase transition registers have an advertised latency of 0 to L (where L is an integer).

In one embodiment, subsequent to said step of introducing, the method further comprises: rescheduling said graph to account for said phase transition registers.

In one embodiment, the data path is represented as comprising a plurality of functional objects each corresponding directly to a hardware element to be implemented in hardware as part of said pipelined parallel stream processor, each functional object being operable to execute a function on said data values propagating through said data path between the at least one input and the at least one output and being connected to other parts of said data path by one or more edge connections.

In one embodiment, said step of performing comprises performing minimum-cut partitioning by: assigning a weight to each edge connection; and partitioning said data path such that the sum of the weights of the edge connections connecting said plurality of discrete regions is minimized.

In one embodiment, the weight of each edge connection is dependent upon the number of bits of data required to be streamed therethrough per cycle.

In one embodiment, said step of performing comprises performing minimum-cut partitioning by: assigning a weight to each functional object; and partitioning said data path such that the sum of the weights of the functional objects within each region is approximately evenly distributed.

In one embodiment, the weight of each functional object is dependent upon the hardware utilization corresponding to said functional object.

In one embodiment, said minimum-cut partitioning utilizes a simulated annealing algorithm.

In one embodiment, said step of performing further comprises selecting the number of discrete regions said data path is to be divided into.

In one embodiment, the number of regions is in the range of 2 to 4.

In one embodiment, the method further comprises performing, on a computing device, partitioning of at least one of said discrete regions into a plurality of sub-divided regions such that each of said sub-divided regions operates on the same clock phase.

In one embodiment, said partitioning into sub-divided regions comprises minimum-cut partitioning.

In one embodiment, the method further comprises: assigning, using high level synthesis, discrete control logic elements to each of said regions of said data path.

In one embodiment, said step of assigning comprises, within one or more regions: grouping functional objects having a cycle position dependent upon common factors; and allocating common control logic to said groups of functional objects.

In one embodiment, the value of said common factors is specified after said optimized hardware design has been implemented in hardware as said pipelined parallel stream processor.

In one embodiment, each control logic element comprises control logic hardware units including a counter and one or more comparators, or a counter and one or more comparators and one or more shift registers having one or more delay elements.

In one embodiment, said step of assigning further comprises, after said step of allocating: for each control logic element, automatically selecting the number of comparators, the number of shift registers and the number of delay elements in the shift register.

In one embodiment, said step of automatically selecting is done to minimize the hardware requirements for each control logic element.

In one embodiment, said step of obtaining comprises the steps of: defining, on a computing device, a processing operation designating processes to be implemented in hardware as part of said stream processor; defining, on a computing device, a graph representing said processing operation; and optimizing, on a computing device, the at least one data path in said graph to produce an optimized graph.

In one embodiment, said stream processor is implemented on a Field Programmable Gate Array or an Application Specific Integrated Circuit.

In one embodiment, the method further comprises the step of forming said optimized hardware design on said stream processor such that said stream processor is operable to perform said processing operation.

In one embodiment, the method further comprises: programming a logic device to embody the generated design.

According to a second aspect of the present disclosure, there is provided a non-transitory computer-readable medium having stored thereon a computer program executable by a programmable processing apparatus, comprising one or more software portions for performing the steps of the first aspect.

According to a third aspect of the present disclosure, there is provided a Field Programmable Gate Array, Application Specific Integrated Circuit or other programmable logic device, having a design generated by: obtaining a scheduled graph representing a processing operation in the time domain as a function of clock cycles, the graph comprising at least one data path to be implemented in hardware as part of said stream processor and comprising at least one input, at least one output and a plurality of parallel branches configured to enable data values to be streamed therethrough from the at least one input to the at least one output as a function of increasing clock cycle; partitioning, on a computing device, said at least one data path into a plurality of discrete regions, each region operating on a different clock phase and having discrete control logic elements; introducing phase transition registers into said data path at a boundary between regions having different clock phases, said phase transition registers being operable to align data separated by a boundary between regions having different clock phases; utilizing, on a computing device, said graph and control logic elements to define a hardware design for implementation in hardware as said pipelined parallel stream processor.

According to a fourth aspect of the present disclosure, there is provided a system for generating a hardware stream processor design, the system comprising: a processor; and a memory coupled to the processor and storing a program that, when executed by the processor, causes the processor to: obtain a scheduled graph representing a processing operation in the time domain as a function of clock cycles, the graph comprising at least one data path to be implemented in hardware as part of said stream processor and comprising at least one input, at least one output and a plurality of parallel branches configured to enable data values to be streamed therethrough from the at least one input to the at least one output as a function of increasing clock cycle; obtain a scheduled graph representing a processing operation in the time domain as a function of clock cycles, the graph comprising at least one data path to be implemented in hardware as part of said stream processor and comprising at least one input, at least one output and a plurality of parallel branches configured to enable data values to be streamed therethrough from the at least one input to the at least one output as a function of increasing clock cycle; partition, on a computing device, said at least one data path into a plurality of discrete regions, each region operating on a different clock phase and having discrete control logic elements; introduce phase transition registers into said data path at a boundary between regions having different clock phases, said phase transition registers being operable to align data separated by a boundary between regions having different clock phases; utilize, on a computing device, said graph and control logic elements to define a hardware design for implementation in hardware as said pipelined parallel stream processor.

BRIEF DESCRIPTION OF THE DRAWINGS

For a detailed description of exemplary embodiments, reference will now be made, by way of example only, to the accompanying drawings in which:

FIG. 5 shows an example of a known arrangement for controlling hardware units;

FIG. 6 shows an alternative example of a known arrangement for controlling hardware units;

NOTATION AND NOMENCLATURE

In the following discussion and in the claims, the terms "including" and comprising" are used in an inclusive fashion, and thus should be interpreted to mean "including, but not limited to . . . ", Also, the term "couple" or "couples" is intended to mean either an indirect or direct connection. Thus, if a first device couples to a second device, that connection may be through a direct connection or through an indirect connection via other devices and connections.

DETAILED DESCRIPTION

The following discussion is directed to various embodiments of the disclosure. The embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The present disclosure relates a method of, and apparatus for, reducing logic switching noise in parallel pipelined hardware. More particularly, the present disclosure relates to a method of, and apparatus for, configuring a hardware design for a pipelined parallel stream processor in which switching noise is reduced.

Figure 1:
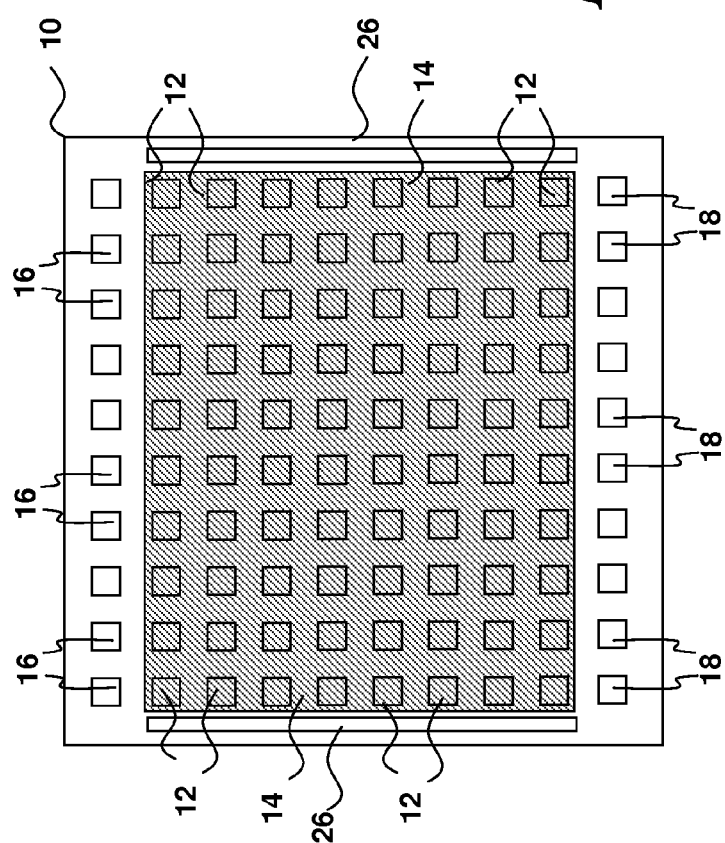
FIG. 1 is a schematic diagram of an FPGA device.

A schematic example of an FPGA device is shown in FIG. 1. Different types of FPGA chips may be used; however the larger and more arithmetic function-rich FPGAs are more desirable. The FPGA 10 comprises a programmable semiconductor device which comprises a matrix of configurable logic blocks (CLBs) 12 connected via programmable reconfigurable interconnects 14 (shown here as the shaded area in FIG. 1). In order to get data into and out of the FPGA 10, a plurality of input pads 16 and output pads 18 are provided.

Figure 2:
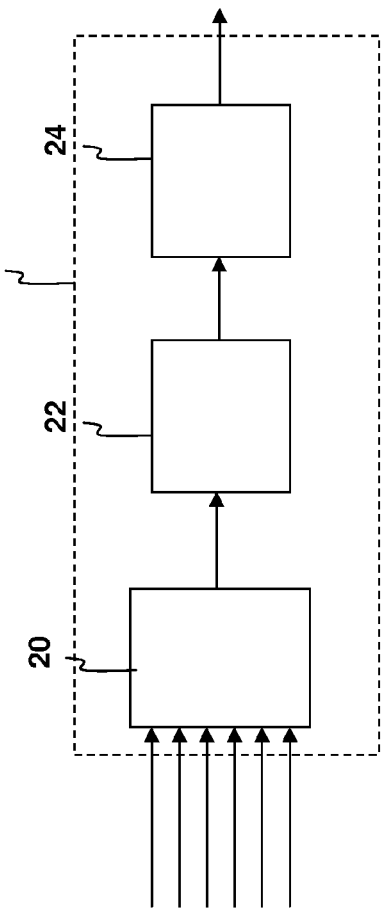
FIG. 2 is a schematic diagram showing a programmable logic block forming part of the FPGA based stream processor of FIG. 1.

The CLBs 12 are the basic logic unit of the FPGA 10. A schematic diagram of a typical CLB 12 is shown in FIG. 2. The CLB 12 comprises a configurable switch matrix comprising typically a 4 or 6 input look up table (LUT) 20, which in some cases may also be configurable as a small buffer of up to about 32 bits, some specialist circuitry (such as, for example, a multiplexer), one or more flip-flop units 22 which act as temporary memory storage and an output 24. Additionally, an FPGA 10 comprises a plurality of block memory units 26. The block memory units 26 comprise addressable memory units which can be used as storage buffers in the FPGA 10. A fixed amount of buffer space is available per FPGA 10. Therefore, it must be carefully allocated.

The LUTs 20 of each CLB 12 can be configured to perform a variety of functions; for example, logic gates such as NAND and XOR, or more complex functions. A typical FPGA may comprise up to $10^5$ LUTs 20. The CLBs 12 are able to operate in parallel, providing a powerful resource for numerically-intense calculations.

FPGA-based stream processors comprise calculation functions mapped into one or more hardware units along the path from input to output. The FPGA then performs the computation by streaming the data items through the hardware units. Each hardware unit will require a particular time period within which to complete the necessary computation. This is known as the latency of the hardware unit and is commonly defined in terms of the number of clock cycles between an input datum entering the hardware unit and the corresponding output datum leaving the hardware unit. The computation takes place as the data moves through the hardware unit, with the output data continually moving "downstream" to further hardware units or to an output. The streaming architecture makes efficient utilization of the computation device, as every part of the circuit is performing an operation on one corresponding data item in the data stream at any point during the calculation.

Figure 3:
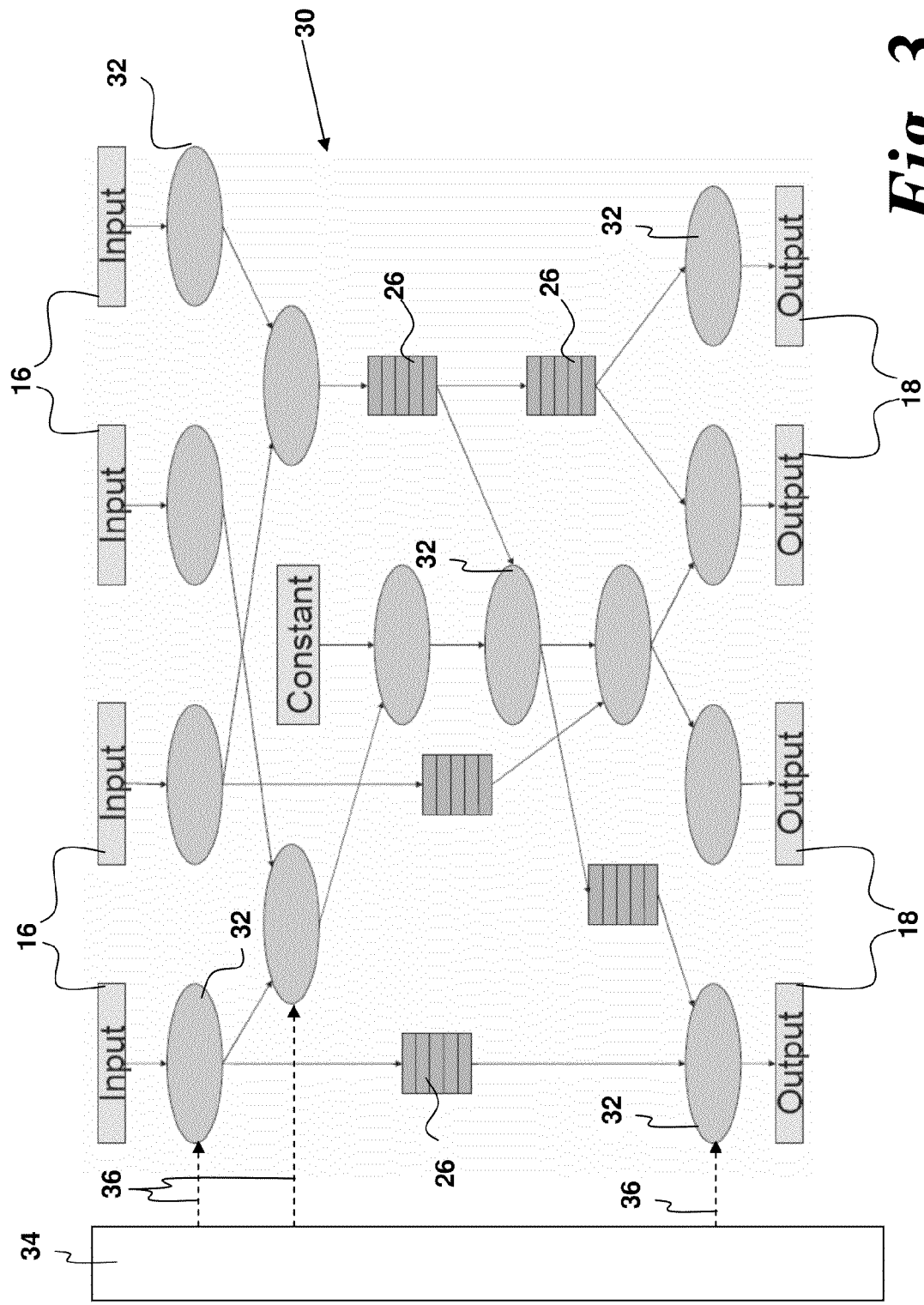
FIG. 3 is a schematic diagram of an example of a possible computation structure for an FPGA-based stream accelerator.

FIG. 3 shows an example of such a streaming architecture created using the CLBs 12 of the FPGA to implement a stream processor thereon. FIG. 3 shows a 4 input 16-$i$, 4 output 18-$i$ stream computing engine which can be implemented on the FPGA stream processor 10.

Between the inputs 16-$i$ and the outputs 18-$i$ is provided a computational data path 30. The computational data path 30 is a graphical representation of an algorithm as it is expressed in hardware. The computational data path 30 is also referred to as a kernel. A typical FPGA 10 may comprise a multiplicity of parallel kernels.

The computational data path 30 is implemented using the CLBs 12 and other logic and comprises arithmetic/logic objects or units 32 (implemented in one or more LUTs 20) and buffer memories 26. In other words, each arithmetic/logic object 32 is implemented in hardware as a hardware element (which may comprise one or more hardware units) on the FPGA. The buffer memories 26 may comprise either block RAM (as provided by the block memory units 26) or distributed RAM (comprising the memory made available through use of the LUTs 20 or flip flops 22). As shown, the computational data path 30 is arranged to process data in parallel. In operation, the data is streamed through the CLBs 12 of the FPGA stream processor 10 and the arithmetic operations 32 are carried out on the data as it is streamed.

The arithmetic/logic objects 32 each require control. Whilst data is being streamed through the arithmetic/logic objects 32, these functional objects are required to be enabled in order to perform the necessary computation. Thereafter, when the data has passed through, or before it arrives, it is necessary to switch disable these units. Therefore, there exists a need to control the arithmetic/logic objects 32 as appropriate.

This is achieved, in one example, through use of a control state machine 34 which is operable to issue control signals 36 to each arithmetic/logic object 32. Only three control signals 36 are shown in FIG. 3 for clarity. However, it is to be understood that each arithmetic/logic object 32 requires control to some degree.

The purpose of the control state machine 34 is, thus to provide control logic to enable the arithmetic/logic objects 32 in the pipeline at the appropriate time. Typically, functional objects are enabled only when three conditions are satisfied: a) there is valid data in the pipeline containing the functional object; b) the data is available at all inputs of the entire data-path; and c) there is buffer space for data at all outputs of the entire data-path.

Figure 4:
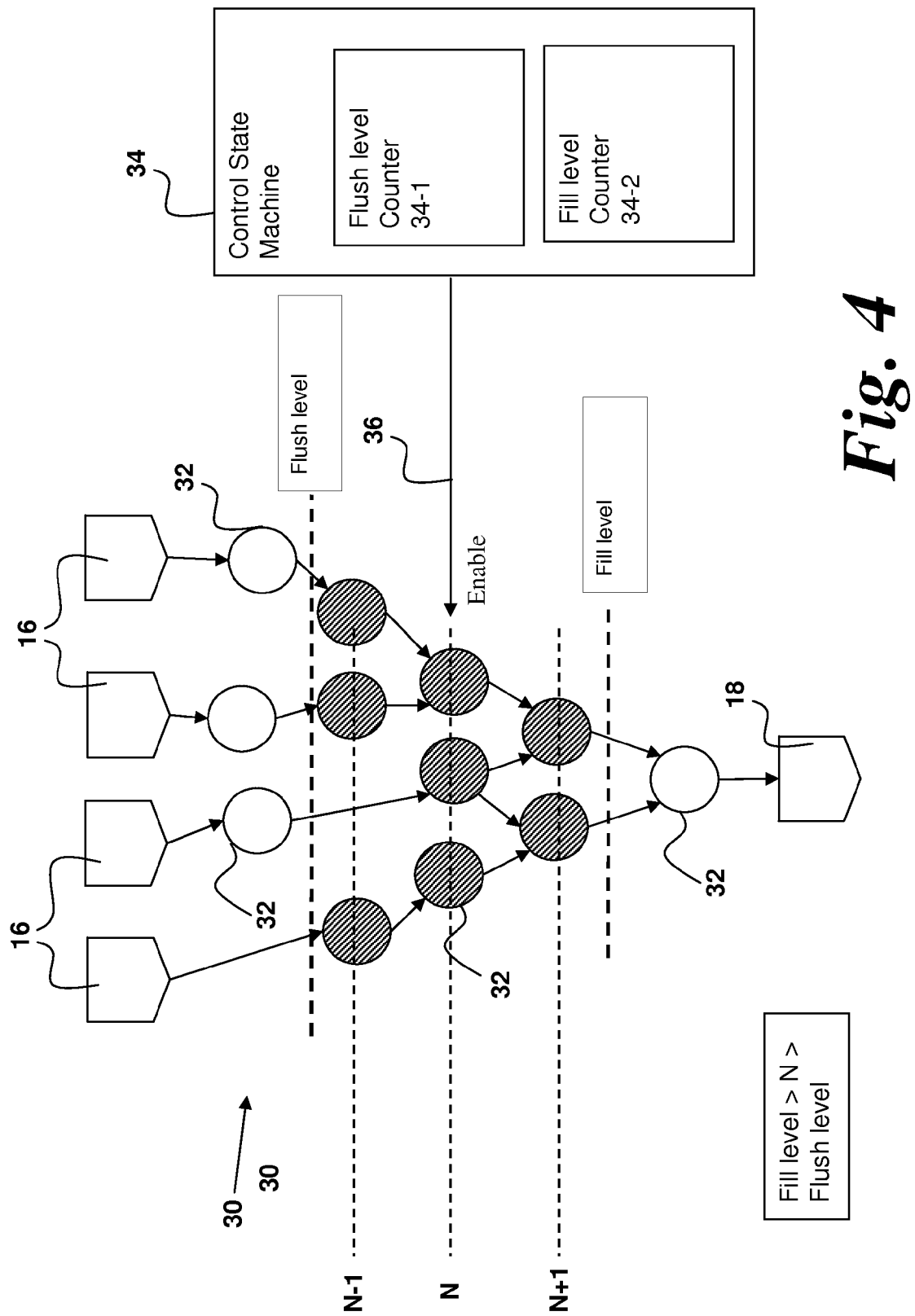
FIG. 4 shows an example of a graph illustrating fill and flush levels.

An example of the operation of control logic as implemented by the control state machine 34 is shown in FIG. 4. FIG. 4 shows a pipeline of arithmetic/logic objects 32 (shown as circles) with control logic implemented by a control state machine 34 to generate enable signals for each object 32.

As data is streamed through the computational data path 30, there will be a "leading edge" to the data, ahead of which there will be no data or no coherent/valid data. This is known as the "fill level" of data. Ahead of the fill level, there is no requirement for arithmetic/logic objects 32 to be enabled. In fact, doing this may generate invalid outputs which may harm the integrity of the streamed data.

There then follows a "packet" of data values which will be streamed through the arithmetic/logic objects 32 for a predetermined number of cycles. At the end of the data sequence, the "trailing edge" of the data (i.e. the last data item in the data stream) is known as the "flush level".

The control state machine 34 therefore requires Flush level 34-1 and Fill level 34-2 counters. Data flows through the pipeline from the inputs 16 to the output(s) 18. As described, the fill level represents the first item of valid data in the pipeline, and the flush level represents the last item of valid data in the pipeline. The objects 32 between the fill and flush levels (shown in FIG. 4 as shaded objects) have, therefore, valid data and are enabled by the control logic commands 36. Objects 32 outside of the fill and flush levels (shown unshaded in FIG. 4) are concomitantly switched off or disabled by the control state machine 34. In other words, the control state machine 34 maintains fill and flush counters to generate enable signals for units in an arithmetic/logic pipeline 30.

The requirement for control logic in arithmetic pipelines has been discussed in the art, for example as described in "*Synthesis and Optimization of Digital Circuits*", G. De Micheli, McGraw-Hill, 1994. In general, control logic accounts for relatively small proportion of the hardware resources in an FPGA design when compared to the arithmetic/logic objects 32.

Conventionally, FPGA circuits are designed using circuit schematics or a hardware description language (HDL) that uses a Register Transfer Level (RTL) abstraction such as, for example, Verilog. HDLs are used to write synthesizable specifications for FPGA hardware. A simulation program is run which enables simulation of the desired spatial and temporal configuration of the FPGA so that the operation of the FPGA can be modeled accurately before being physically created.

HDLs based on an RTL abstraction are explicitly parallel and include an explicit notion of time. The HDL user explicitly specifies the behavior of logic on a cycle-by-cycle basis, which means that the data-path and control state machine must be designed and specified exactly. Once the data path has been formed at the HDL level, a synthesis program is run to generate a 'netlist' of connected FPGA primitive components, including look-up tables (LUTs) and registers that physically implement the RTL design.

In contrast to HDLs based on RTL abstraction, High Level Synthesis (HLS) tools are used to generate a graph defining a data path such as the data path 30 shown in FIG. 3. The data path includes a sequence of arithmetic/logic operations to be implemented as a stream processor. The sequence of arithmetic/logical operations can then be scheduled at the HLS level.

Once the data path has been scheduled, the HLS tool can then be used to generate a synthesizable RTL implementation which can then be used by HDL tools based on RTL abstraction to generate a hardware design. Such implementations typically comprise a pipelined data path component with connected arithmetic/logic units and a finite state machine (FSM) component, where the FSM controls the enable signals for the arithmetic units and manages flow-control for input/output channels. An example of this is shown in FIG. 5.

As an example, FIG. 5 illustrates a graph defining a simple streaming data path 40. A graph is a representation of a desired processing operation (e.g. mathematical calculations such as convolutions) to be implemented in hardware as part of a stream processor.

The graph represents the processing operation as a parallel structure in the time domain as a function of clock cycles, with data "flowing" along a data path from the input(s) to the output(s) with increasing clock cycle. The data path 40 comprises discrete functional arithmetic/logic objects (or nodes) which perform processing operations on the streamed data. The discrete objects correspond directly to hardware elements to be implemented as part of a stream processor on the FPGA. Hardware elements may comprise one or more hardware units (such as CLBs) on the physical FPGA.

FIG. 5 shows a data path 40 having four inputs 42 and a single output 44. The data path 40 comprises three arithmetic/logic objects (or nodes) 46, 48, 50. In this example, the arithmetic/logic objects 46, 48 comprise adders and object 50 comprises a multiplier. A delay buffer 52 is also provided. The objects 46, 48, 50 and delay buffer 52 are connected between the inputs and output by means of "edges" 54 (or interconnects).

As shown in FIG. 5, the objects 46, 48, 50, buffer 52 and edges 54 define a plurality of branches within the data path 40. In general, a data path 40 represents a particular process operation or function and is implemented as a pipelined circuit through which the data flows. A kernel may also comprise a plurality of branches (also called control paths) which do not compute directly on the data but may configure the data path at different points in time to change its function. These branches may be dependent upon other branches, or may be independent or semi-independent depending upon the nature of the bulk computation performed by a particular data path.

A finite state machine (FSM) 56 is provided. The FSM 56 provides control (or enable) signals to each of the objects 46, 48, 50 and buffer 52 in the form of enable signals 58-1, 58-2 and 58-3 (it is to be understood that signal 58-1 will also enable object 46 although this is not shown here). The appropriate object 36, 48, 50 and/or buffer 52 must be enabled at an appropriate time as data is streamed through the pipelined data path 40.

Each arithmetic/logic object 46, 48, 50 has a particular latency associated therewith, i.e. the time it takes an input datum to the adder 46, 48 or multiplier 50 to propagate to a result datum at the output and be released as input to the next stage of the data path 40. In other words, the data propagates through the data path 40 in a lock step manner—each object has a latency associated therewith. In the common case a global clock is distributed to all nodes (running for example at 100 MHz), and the latency of each object is measured in number of clock cycles.

Therefore, the enable signals must be issued at the correct time in order that the relevant objects/nodes are enabled at the correct time for the necessary calculations. Therefore, if objects 46, 48, 50 each have a latency of one clock cycle, then signal 58-1 will need to be enables at time T, with signal 58-2 enabled at time T+1 and signal 58-3 enabled at time T+2 and so on.

Whilst the example of FIG. 5 shows three "layers" of enable signals, in practice a data path may comprise many thousands of objects/nodes each of which require control from the FSM 56. The large number of nodes causes a high fan-out for signals that exit the FSM 56 and signals within the FSM 56. High fan-out signals rapidly become the bottleneck to performance because they have to reach every node within a finite number of clock cycles.

In addition, the signal path length can become an absolute limit on the size of a data path and the maximum clock rate. For example, consider an FSM 56 that generates control logic for a large data path that spans a large area on the FPGA. The control signals must propagate to the furthest arithmetic unit from the FSM within a single cycle. As the distance increases, the cycle time must also increase and therefore the rate of compute for the entire circuit.

An alternative solution to the problem of fan-out is shown in FIG. 6. FIG. 6 shows the data path 40 of FIG. 5. However, in this arrangement, the FSM 56 is replaced by an enable bit generator 60. The enable bit generator 60 includes a plurality of delay buffers 62-1 to 62-3. In this configuration, an enable bit is generated by the enable bit generator 60 at the start of valid data and this enable bit is propagated along the pipeline, with appropriate delay buffers 62-1 to 62-3 to ensure the enable bit arrives at the appropriate object at the appropriate time. It then de-asserts with invalid data to create a pipeline "bubble".

The enable bit is delayed using buffers 62-1 to 62-3 which provide a delay of exactly the same number of cycles as the data. This ensures that the asserted enable bits line up with the valid data. On an FPGA, these buffers are implemented using registers, shift registers or RAM blocks depending on the length of the delay.

Another technique is physical synthesis. Physical synthesis is a process whereby modification and optimization of the hardware design is done at the RTL level. The performance of circuits is improved by applying transformations to the circuit netlist once knowledge of the physical arrangement (placement and routing) of the hardware design on a chip is available.

Netlists of typical designs at the RTL level are several orders of magnitude more complicated than at the data flow graph level. This is because arithmetic/logic objects at the data flow level (for example, a floating point addition) comprise many hardware units at the RTL level (for example, a two input OR gate).

Furthermore, at the RTL level, the scheduling of the data path design is fixed. It is possible, for example, to duplicate existing registers (replication), move registers (retiming) but not to insert additional registers which will change relative timing of operations and break the functionality of the design.

"ASC: A Stream Compiler for Computing With FPGAs" O. Mencer, IEEE Transactions On Computer Aided Design Of Integrated Circuits And Systems 2006, Vol 25; No. 9, pages 1603-161 describes a high level synthesis tool that generates a scheduled pipelined data path and control logic. Other examples may be found in US-A-2007/0300193; and U.S. Pat. No. 7,257,800.

Further examples of RTL-stage optimization of control logic can be found in "Timing Optimization of FPGA Placements by Logic Replication", Breaudo, G. (2003) Proceedings of Design Automation Conference (pp. 196-201).

There are other techniques for generating FSMs that provide control logic for a pipelined data path, for example "System-level Time-stationary Control Synthesis for Pipelined Data Paths" Kim, J. T, (1999). VLSI Design Vol 9 No 2, 159-180. In this example the goal is to minimize the area required for the FSM controller and optimization of the physical implementation for timing performance is not addressed.

Irrespective of the method used to produce the FPGA design, an issue can arise with power supply noise in digital electronic circuits. An FPGA may comprise many thousands of logic units, each of which must be switched appropriately. This switching of circuits within a chip such as an FPGA is synchronized across an entire chip using one or more clock signals. This ensures that all logic elements running from the same clock signal switch in unison.

As a result, when a circuit on a chip or FPGA is switched, there is a surge in the current drawn from the power supply. The surge in current drawn is proportional to the amount of logic being switched. This issue is particularly relevant to a large circuit design such as that typically found on an FPGA, because the current surge scales in relation to the amount of switching logic.

In summary, to date, schemes and hardware for providing the control logic for a data path structure of parallel pipelined hardware such as can be implemented on an FPGA have suffered from a technical problem that switching noise during operation of the FPGA can cause significant technical issues.

As set out above, stream computing is an efficient way to process large amounts of data with arithmetic hardware. However, the performance of stream computing devices is often limited by control logic as described above.

As set out above, a graph is a way of describing an algorithm as a parallel structure in the time domain using a data path to represent the desired algorithm. A data path can be represented graphically as a mathematical structure consisting of a group of functional objects (or nodes) connected by edges (or edge connections). Nodes represent discrete functional objects such as arithmetic/logic objects or compute objects. Edges represent connections between two objects. In other words, functional objects represent operations and edges show where the output of each operation feeds into the input of another.

A typical FPGA 10 will comprise a number of discrete data paths. The number of data paths on a typical FPGA is typically around 10 or less. However, each data path may comprise a multiplicity of parallel branches which comprise, in total typically $10^2$ to $10^5$ computation elements. This enables massively parallel calculations to be performed.

High-level stream scheduling software can be used to optimize a graph to provide an optimized hardware design. In one example, this may be done as described in U.S. application Ser. No. 13/029,696. In this co-pending application, linear algebraic expressions for the latencies and data processing of the nodes can be utilized to provide an optimum scheduled data path which uses the minimum required amount of hardware resources, e.g. buffering.

The present disclosure now contemplates, for the first time, that control logic should be optimized for physical implementation at the same time as the streamed data path. Conventionally, as described above, physical optimizations occur at the RTL stage after the scheduling of the data path and timing of the control logic is fully specified. The advantage of this approach is that the optimizations occur at a higher level of abstraction, where only the functionality of the data path is specified, and the scheduling of the data path and precise cycle-by-cycle behavior of the control logic is not defined.

Furthermore, the optimization of control logic can be done on a global scale with full visibility of the entire streaming data path. This provides advantages over techniques such as physical synthesis which attempt to optimize control logic at the RTL stage, because the high-level description of hardware elements is often less complex, enabling more optimal scheduling and hardware configuration solutions to be found.

Figure 8:
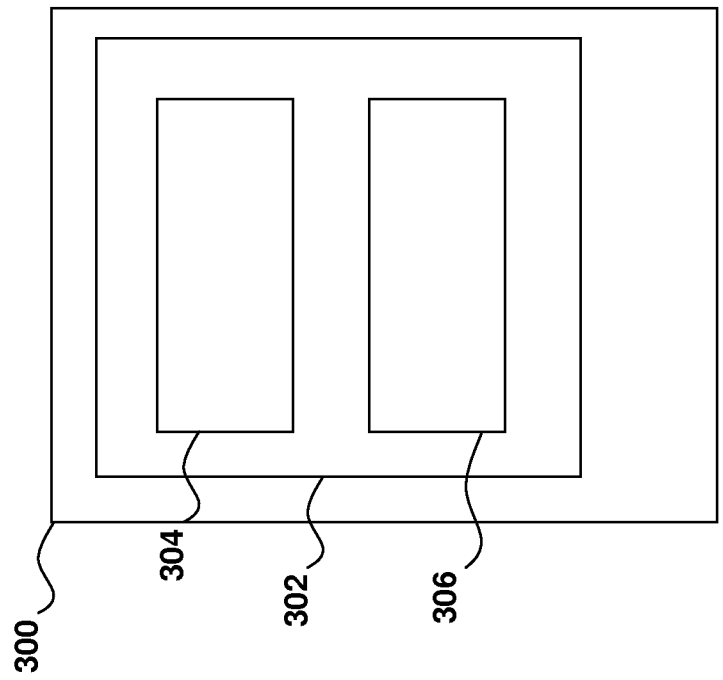
FIG. 8 shows a schematic of a computing apparatus for carrying out the method of the present disclosure.
Figure 7:
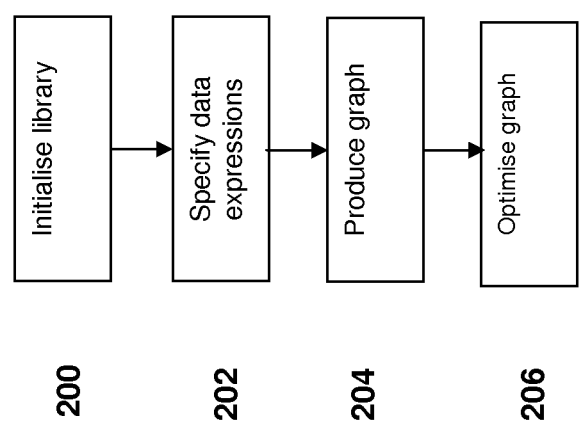
FIG. 7 shows a flow chart of the method of generating a graph.

An embodiment will now be described with reference to FIGS. 7 to 10. FIGS. 7 and 8 relate to obtaining a graph in which one or more data paths are configured and scheduled. It is to be understood that the steps defined therein may form part of a single, high-level process for scheduling a data path and for adding control logic thereto when taken in combination with the first, second or third embodiments of control logic implementation. Alternatively, a high-level scheduled design may be designed separately and control logic added prior to forming the RTL design.

Step 200: Initialize Library

The method can be run on a standard computing apparatus 300 or other programmed or programmable apparatus running an operating system such as Windows or Linux.

In this embodiment, the method is implemented as application 302 which utilizes a Java library 304. However, other languages may be used and these will be apparent to the skilled person. For example, the application could be run in C, C++ or any other suitable programming language.

The application 302 has a graphical user interface (GUI) 306 which enables a use of the computing apparatus 300 to enter commands and access the application.

At step 200, the application and Java library is initialized. The method then proceeds to step 202.

Step 202: Speck Data Expressions

Through the GUI 306, the user specifies the desired data flow as expressions. These may comprise commands such as add or multiply, or may specify approaches such as 2D cross-convolutions.

Once these commands and expressions have been entered, the method proceeds to step 204.

Step 204: Produce Graph

Once the commands have been entered at step 202, the application 302 utilizes the Java library 304 to produce a graph represented by Java objects.

Each object has specific properties used by the compiler. One important property for scheduling of a streaming data path is the latency of the object, i.e. how long (in clock cycles) the object will take to perform its given function or operation and output the data values to the next object, set of objects or output.

Figure 9:
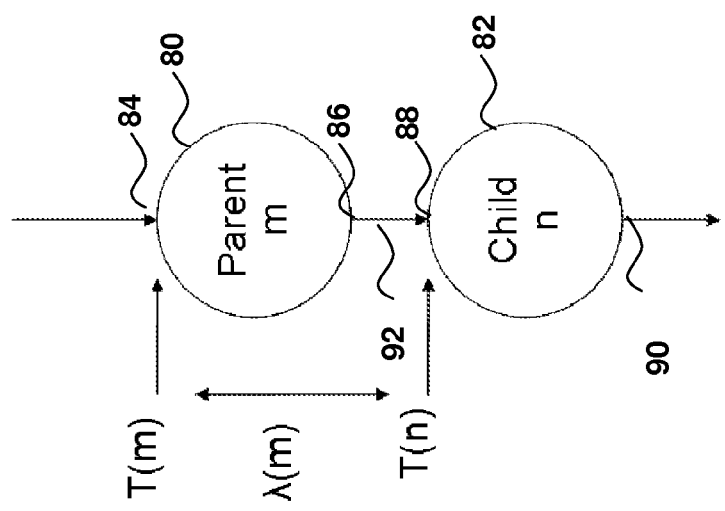
FIG. 9 shows an example of the latencies for a functional object pair.

FIG. 9 shows the latency of a node or object. FIG. 9 shows two objects 80, 82. The object 80 has an input 84 and an output 86. The object 82 has an input 88 and an output 90. The two objects 80, 82 are connected together by an edge 92. The edge 92 extends between the output 86 of object 80 and the input 88 of object 82.

Object 80 is the "parent" object m and object 82 is the "child" object n. Data arrives at the parent object m 80 at time T(m). Since the object 80 comprises a compute unit, a finite amount of time is required for the computation on received data to be performed. Such a computation may involve LUTs, shift registers or other elements. The time required to perform the calculation is known as the latency of the parent object m 80 and is defined as $\lambda(m)$. The objects 80, 82 are representative of, and correspond to, one or more hardware units (i.e. CLBs 12) on the FPGA 10 and the latencies thereof correspond to those of the actual hardware.

Therefore, the data will arrive at the input 88 of the child object n 82 at time T(n). T(n) must, therefore, be greater than or equal to the time T(m) that the data arrives at the input 84 of the parent m, plus the latency $\lambda(m)$ of the parent object m 80. The time T(n) will only be equal to T(m) plus $\lambda(m)$ if the edge 92 has zero latency. In the common case, edges do not have latency since they do not contain any flip-flops and only represent connections between objects. In the following examples, objects are described as having latency. However, alternative formulations may be utilized whereby edges are defined as having latency, or both objects and edges may have associated latencies. The method then proceeds to step 206.

Step 206: Optimize Graph

In step 206, latency information in the graph produced in step 204 is extracted. The latency information can then be used to optimize the graph to produce a scheduled design. This may, for example, be done in accordance with U.S. patent application Ser. No. 13/029,696 where a set of linear inequalities are solved and buffering inserted to schedule the data path. However, other approaches may be used. The buffering is then optimized to produce a scheduled, optimized graph.

Figure 10:
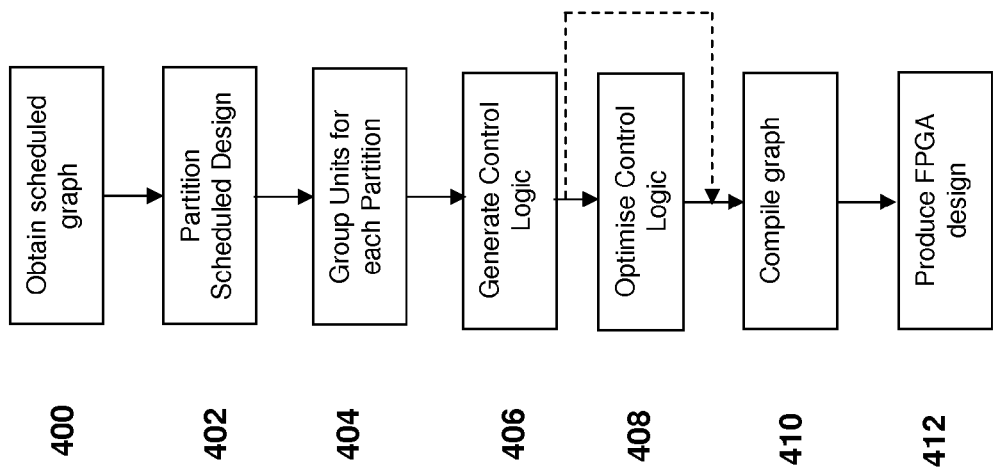
FIG. 10 shows a flow chart of a method of implementing control logic according to an embodiment of the present disclosure.

The optimized graph may then be used in the following method according to a first embodiment of the present disclosure as illustrated in FIG. 10.

Step 400: Obtain Scheduled Design

In this step it is required to obtain a graph representing a processing operation in the time domain as a function of clock cycles. The graph should comprise at least one data path to be implemented in hardware as part of a stream processor and comprises a plurality of parallel branches configured to enable data values to be streamed therethrough. The design in this step may be obtained from steps 200-206 described above, or from any other method.

Figure 11:
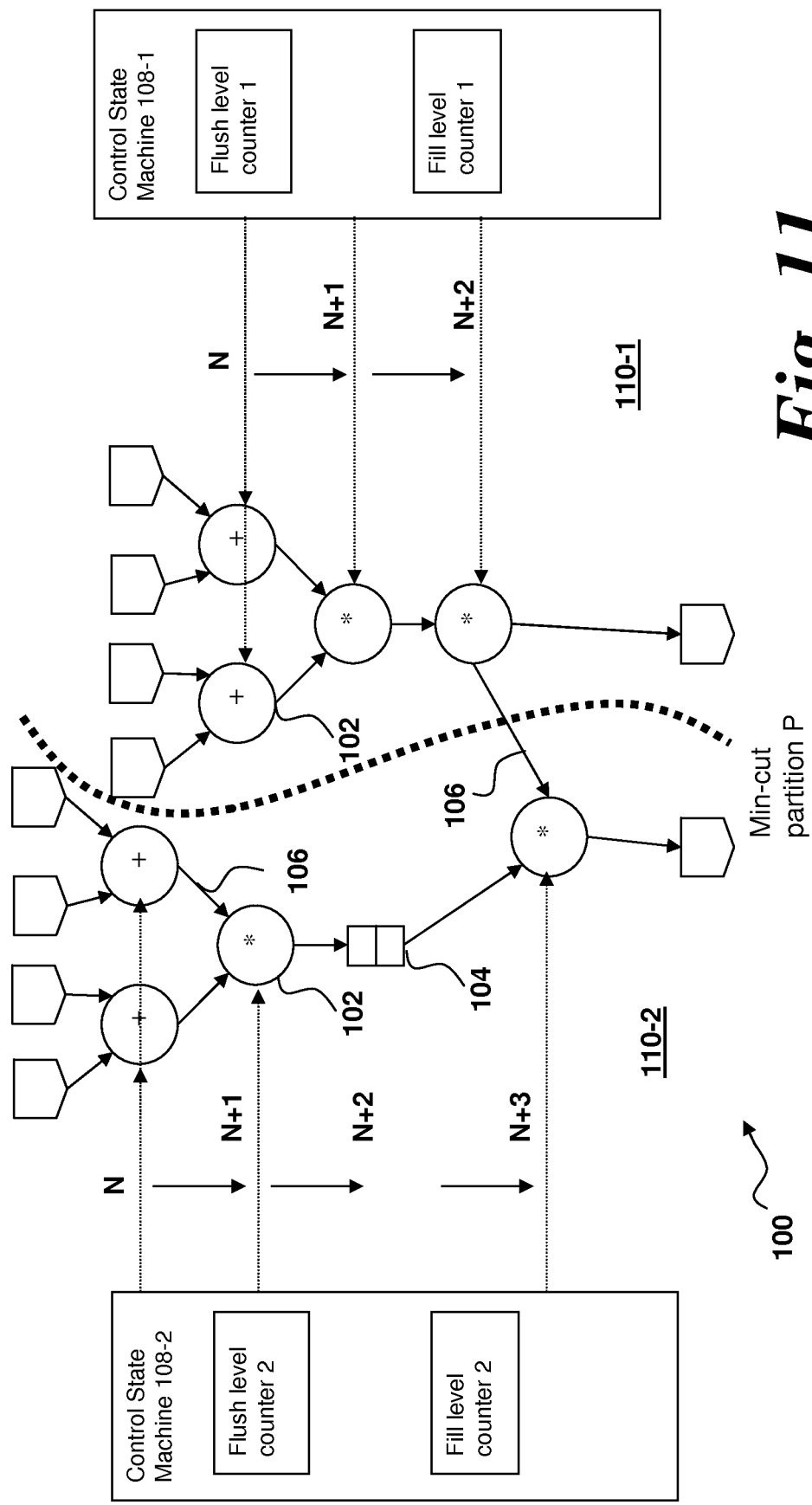
FIG. 11 shows a schematic diagram of a graph illustrating a data path partitioned into discrete regions.

An example of this is shown in FIG. 11. In FIG. 11, a scheduled data path 100 is shown and comprises a plurality of arithmetic/logic objects 102 and buffer elements 104, each with a position in the schedule of N+X stream cycles where N is a function of run-time configurable variables and X is an integer constant. The arithmetic/logic objects 102 and buffer elements 104 are connected by edges 106.

In this embodiment, the data path 100 is scheduled at a high level of abstraction in parallel with control logic 108 prior to the RTL stage of the hardware design. In other words, by performing these techniques during high-level synthesis, the data path 100 configuration can be manipulated as appropriate to optimize, amongst other things, control logic placement. The method then proceeds to step 402.

Step 402: Partition Scheduled Design

At step 402, control logic 108 can be assigned to the scheduled data path obtained in step 400. However, in order to do so it is necessary to divide the scheduled data path into one or more regions. Separate, or replicated, control logic can then be assigned to the arithmetic/logic objects 102 within each region. This assists in minimizing the fan-out of the control signals because each replicated control logic element has only to reach the arithmetic/logic objects 102 within each region rather than across the whole design.

In the example of FIG. 11, the data path 100 is divided into two regions 110-1, 110-2 and control logic 108 is replicated into two discrete control logic elements or control state machines 108-1, 108-2 to control the objects 102 in each region 110-1, 110-2. In this embodiment, the replicated part of the control state machine 108-1, 108-2 corresponds to the fill/flush counters. The replication of control logic minimizes the fan-out of enable signals to the objects 102.

In the context of the present application, the term "replication" is intended to refer to provision of more than one element of control logic in the hardware design. There is no explicit requirement for the two control logic elements to be identical and they may issue enable signals at different timings or to regions of the hardware design as required.

In this embodiment, minimum-cut (or min-cut) partitioning is used to control the replication. It has been found that minimum-cut partitioning enables a useful compromise between fan-out of control signals and resource usage of replicated control logic.

The motivation for the min-cut partitioning is not to share circuits between unrelated functional objects 102. Unrelated functional objects 102 are those that are not already going to be implemented in nearby regions of a chip because of existing data-path connections. A part of the control state machine 108 (fill/flush counters, in this embodiment, although other parameters may be utilized) is replicated for each minimum-cut region, and share the result for all functional units 102 in that region.

Several algorithms exist to find minimum cuts and any suitable method may be utilized. For example, a simulated annealing algorithm may be used. The object of the algorithm is to find a nontrivial region of the graph such that the cut weight (i.e. the sum of the weights of the edge connections connecting each discrete region) is a minimum. In the context of high-level stream processor design, each edge 106 has a "weight" which relates to the number of bits for the objects 102 that the particular edge 106 connects, for example.

The present disclosure uses minimum-cut theory to region the data path 100 into a plurality of cuts such that the weight of the cut is as small as possible.

While the example of FIG. 11 illustrates two regions 110-1, 110-2 separated by a partition P, any number of regions 110-R may be specified (where R>1). The number of regions 110 into which the data path 100 is divided can be specified by the user and may take the form of, for example, a variable entered into the GUI 406 as described above. Alternatively, the variable R could be optimized automatically to give the best trade-off between hardware consumption and performance. R would, typically, be in the region of 2 to 128.

By specifying the number R of regions 110-R a particular data path 100 is divided into, a trade-off between the required amount of control logic 108-R and the timing performance of the resulting stream processor can be obtained.

Step 404: Group Units for Each Region

At step 404, the N+X schedule time for each object 102 is examined and objects 102 with the same N values are grouped. Note that N is a function of variables that may change at runtime. In other words, objects 102 are grouped based on common factors shared therebetween.

Within each region 110-1, 110-2, for the respective replicated control state machine 108-1, 108-2, objects 102 with the same N value are then grouped to share the bulk of the control logic. Control logic will be shared across these objects where the estimate for the cost of sharing (e.g. number of registers in the shift register) is lower than the estimate for the resource cost of generating additional control logic (e.g. the number of registers in a counter plus comparator).

Step 406: Generate Control Logic

Figure 12:
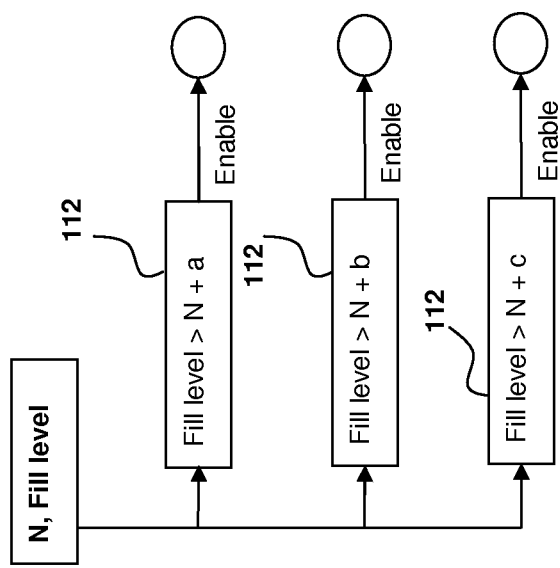
FIG. 12 shows an example of control logic implementation in hardware.

At step 406, once the objects 102 are grouped as set out above, control logic can be implemented. Consider an example where three objects 102 are scheduled at cycles N+a, N+b and N+c within the same region 110-R. FIG. 12 shows an arrangement whereby a comparator 112-1, 112-2, 112-3 is implemented for each respective cycle of the control logic element 108-R relating to region 110-R.

Various alternatives are available for the implementation of control logic, and this can be implemented automatically as required by the compiler. Alternatively, specific control logic can be implemented by the user as required.

For simplicity, FIG. 12 shows only the logic required to enable three objects when the fill level has progressed to the pipeline stage of that object and hence valid data has reached that pipeline stage. Other conditions required to enable the object, for example that the flush level has not progressed to the pipeline stage of the logic, are generated using a similar scheme and combined with a Boolean AND function. The control logic required may vary for each type of object, for example purely arithmetic/logical objects may be enabled even when the input data is invalid, whereas an object that outputs data to a FIFO stream must only be enabled when the data is valid.

Step 408: Optimize Control Logic

Step 408 is, in one embodiment, optional. The method may proceed directly to step 410. In step 408, the compiler may optimize control logic in the following manner. As shown in FIG. 12, a comparator 112-1, 112-2, 112-3 may be used for each clock cycle. This approach is accurate and enables fast control logic to be implemented. However, this approach consumes on-chip resource to implement the necessary control.

Alternatively, short delay chains may be implemented automatically to minimize logic utilization of the control logic. This is done by replacing a counter and multiple comparators with a single counter/comparator 114 and a shift register 116 with multiple taps (or delay elements). A shift register generally comprises a cascade of flip flops (each corresponding to a delay element) sharing the same clock signal. The flip-flops are connected such that the output of each flip-flop is directly connected to the input of the next flip-flop in the chain, resulting in a circuit that shifts data within the bit array by one position per clock cycle.

Figure 13:
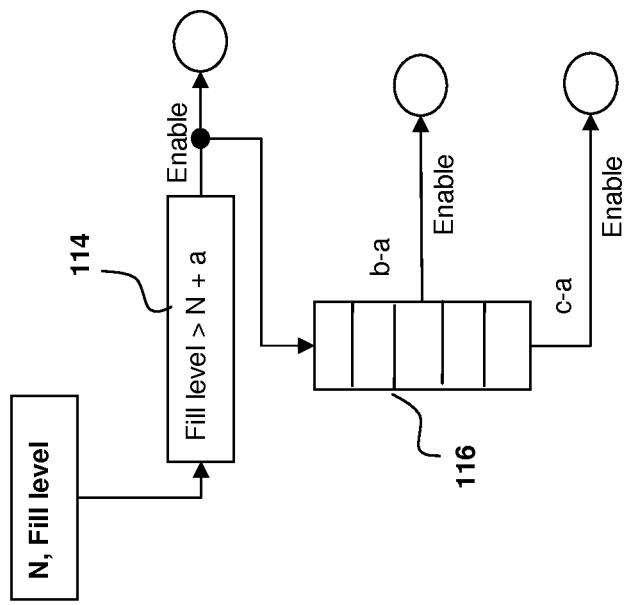
FIG. 13 shows an alternative example of control logic implementation in hardware.

An example of the hybrid comparator/shift register control logic element is illustrated in FIG. 13. If, similarly to the example of FIG. 12, three objects 102 are scheduled at cycles N+a N+b, N+c, within the same region 110-P, a single comparator 114 can be utilized on the flush/fill level for all objects 102 scheduled at cycle N+a, with a shift register 116 of total length c-a which is used to transfer the enable signal to the objects 102 scheduled at cycles N+b and N+c via taps at b-a, and c-a.

Thus, this approach to scheduling and design of control logic enables a trade-off to be achieved between logic used to recompute the enable signal and logic used to delay a previously computed enable signal. The integration of data path scheduling and control logic implementation during high-level synthesis enables an optimum configuration of control logic for given hardware/performance requirements. Such a technique is impossible or impractical for conventional RTL approaches.

The technique is possible in this disclosure because the relationship between enable signals, for example that one enable signal is exactly the same as another but delayed by a fixed number of cycles is explicit in the high-level representation of the data-flow graph but not in the resulting RTL design. The method then proceeds to step 410.

Step 410: Compile Graph

Once the optimized schedule and control logic arrangement has been determined, the graph can be compiled into a format such that the physical FPGA can then be formed. Compilers and compilation methods are well known in the art and the skilled person would be readily aware of software, hardware and implementations that could be used with the present disclosure. The method then proceeds to step 412.

Step 412: Produce FPGA Design

Once the graph has been compiled into the correct format in step 410, the FPGA design for the stream processor is formed. The FPGA design can then, optionally, be used to implement the optimized data paths (or kernels) and data flow in hardware. Once the FPGA design has been formed in hardware on an FPGA chip or device, it can be used as required by the end user to perform the stream calculations defined in step 202.

Figure 14:
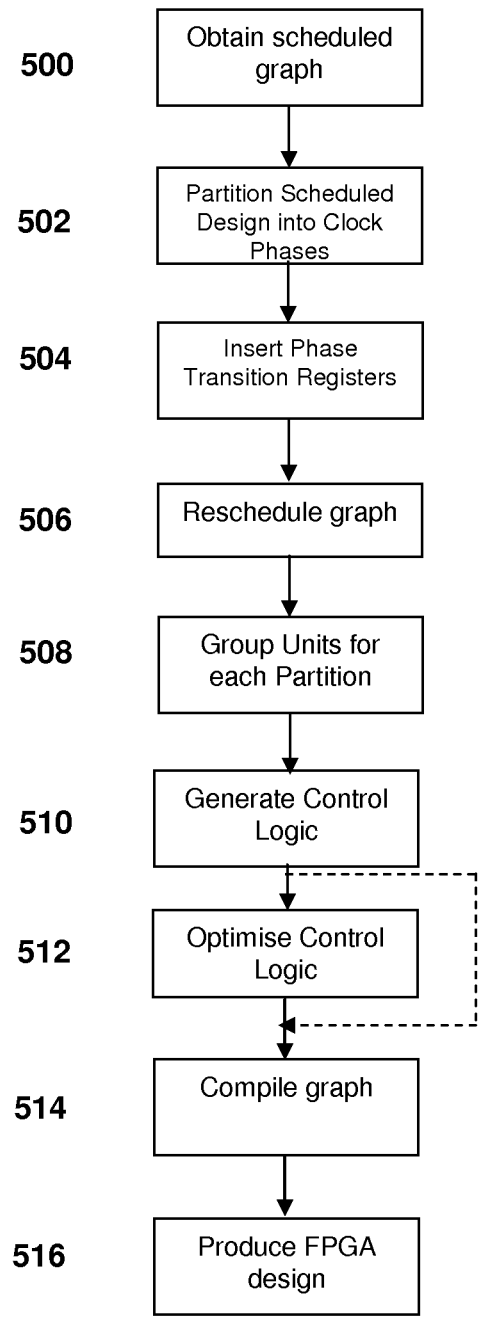
FIG. 14 shows a flow chart of a method of implementing control logic according to an embodiment of the present disclosure.

An alternative embodiment will now be described. The optimized graph produced in steps 200-206 may also be used in the following method according to a second embodiment of the present disclosure as illustrated in FIG. 14.

As set out above, power supply noise can be an issue in digital electronic circuits. Switching of circuits within a chip such as an FPGA is synchronized across an entire chip using one or more clock signals. This ensures that all logic elements running from the same clock signal switch in unison.

Therefore, when a circuit on a chip or FPGA is switched, there is a surge in the current drawn from the power supply. The surge in current drawn is proportional to the amount of logic being switched. This issue is particularly relevant to a large circuit design such as that typically found on an FPGA, because the current surge scales in relation to the amount of switching logic.

The following embodiment of the disclosure applies partitioning of the graph to enable regions to be provided which run on different clock phases, concomitantly reducing the amount of logic being switched at any one time. This may be facilitated by each partitioned region having discrete control logic, which makes implementation of different clock phases straightforward.

In one implementation of this embodiment, the data path is scheduled at a high level of abstraction in parallel with control logic prior to the RTL stage of the hardware design, in common with the previous embodiment. In other words, by performing these techniques during high-level synthesis, the data path configuration can be manipulated as appropriate to optimize, amongst other things, control logic placement.

However, the following embodiment is equally applicable to methods and arrangements whereby FPGA circuits are designed using circuit schematics or a hardware description language (HDL) that uses a Register Transfer Level (RTL) abstraction such as, for example, Verilog. HDLs based on an RTL abstraction are explicitly parallel and include an explicit notion of time. Once the data path has been formed at the HDL level, a synthesis program is run to generate a 'netlist' of connected FPGA primitive components, including look-up tables (LUTs) and registers that physically implement the RTL design.

While the use of high-level synthesis for performing partitioning and assignment of control logic has certain advantages as described above in relation to the first embodiment, it may be appropriate in certain circumstances to partition the control logic into clock phases at a lower level of abstraction. Therefore, once the graph has been provided in step 500, subsequent steps 502 onwards need not be performed using high-level synthesis and these steps may be carried out using lower level techniques.

Step 500: Obtain Scheduled Design

In this step it is required to obtain a graph representing a processing operation in the time domain as a function of clock cycles. The graph should comprise at least one data path to be implemented in hardware as part of a stream processor and comprises a plurality of parallel branches configured to enable data values to be streamed therethrough. The design in this step may be obtained from steps 200-206 described above, or from any other method.

Figure 15:
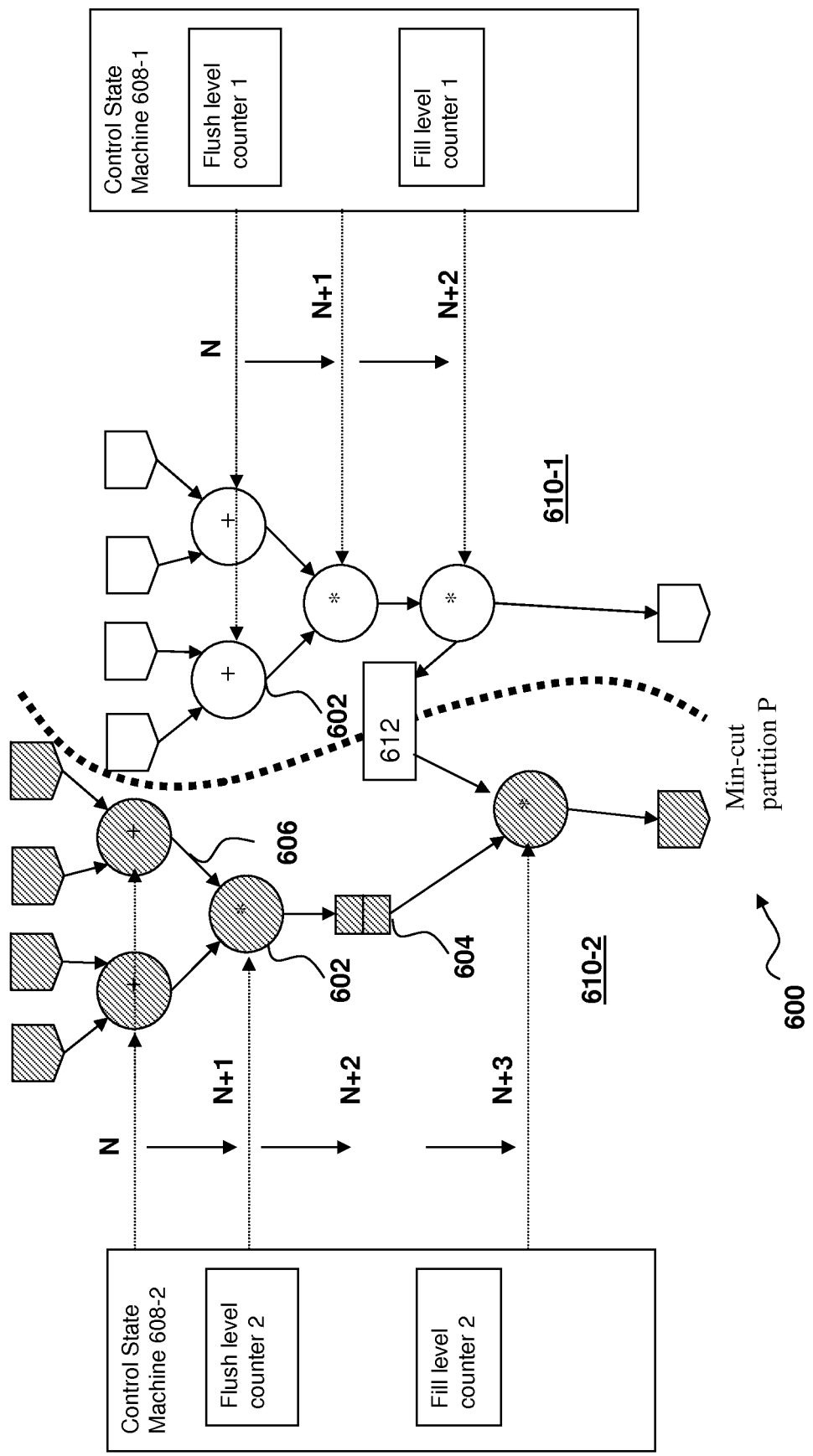
FIG. 15 shows a schematic diagram of a graph illustrating a data path partitioned into discrete clock phase domains.

An example of this is shown in FIG. 15. In FIG. 15, a scheduled data path 600 is shown and comprises a plurality of arithmetic/logic objects 602 and buffer elements 604, each with a position in the schedule of N+X stream cycles where N is a function of run-time configurable variables and X is an integer constant. The arithmetic/logic objects 602 and buffer elements 604 are connected by edges 606. In this sense, the data path 600 is similar to data path 100 of the first embodiment.

Step 502: Partition Scheduled Design Into Clock Phases

In step 502, the scheduled design is partitioned into regions that run on different clocks, or a different phase of the same clock. This reduces the amount of logic which is being simultaneously switched at a given time and, concomitantly, reduces the magnitude of the instantaneous current requirements during the switching.

In this embodiment, the scheduled design is partitioned into two or more sections so that each section has a different clock phase. In the example of FIG. 15, the data path 600 is divided into two regions 610-1, 610-2 and control logic 608 is replicated into two discrete control logic elements or control state machines 608-1, 608-2 to control the objects 602 in each region 610-1, 610-2. In this embodiment, the replicated part of the control state machine 608-1, 608-2 corresponds to the fill/flush counters. Each replicated control state machine 608-1, 608-2 operates on a different clock phase and controls respective objects 602 on these different phases. This is illustrated by the shading of objects 602, 604 in region 608-2.

If step 502 is carried out as part of high-level synthesis, in this embodiment minimum-cut (or min-cut) partitioning is used to divide the scheduled data path into multiple clock phase regions or domains. It has been found that minimum-cut partitioning enables a useful compromise and the partitioning is carried out automatically as a balanced min-cut partitioning. In this embodiment, the use of min-cut partitioning is operable to reduce the number of cross-clock paths (as shown by the paths crossing the partition P) and balanced to ensure an approximately equal amount of logic (e.g. number of hardware elements required to implement the functional units in each region) is provided on the same clock phase.

One example is a simulated annealing algorithm which can be utilized to perform the partitioning. However, the skilled person would be aware of alternative algorithms that would also be applicable; for example, any exact or inexact algorithm for weighted object/node and edge graph partitioning could be used. In this case, the edge weight, which is utilized to calculate the cut cost, is the width of the data path 600 between units. The object weight (to calculate the balance of objects within each region) is an estimate of the logic utilization of a particular object 602.

If partitioning is carried out at a lower level of abstraction, any appropriate mechanism for partitioning could be used. This may be minimum-cut, manually-applied, random, or based on the physical arrangement of logic on the FPGA on which the stream processor is to be formed.

While the example of FIG. 15 illustrates a data path 600 divided into two clock phase domain regions 610-1, 610-2, any number of regions 610-C may be specified (where C>1). The number of regions 610 into which the data path 100 is divided is generally specified automatically, and is limited by the number of clock phases which can be independently used while maintaining the integrity of data as it flows through the stream processor. This will depend upon the size of the stream processor and the clock frequency at which the stream processor is designed to run.

Step 504: Insert Phase Transition Registers

Once the scheduled data path 600 is partitioned into two or more clock phase regions in step 502, the objects 602 within each region will operate on a different clock phase. When partitioning a kernel into multiple clock phases, it is important to maintain the synchronization of data flowing between logic elements running from different phases of the clock. Therefore, in order to ensure data integrity across regions, it is necessary to introduce phase transition registers. These may be done manually, or may be added automatically by, for example, a compiler. A phase transition register 612 is shown in FIG. 15.

Phase transition registers are inserted for two purposes. Firstly, phase transition registers ease timing closure for half-cycle paths between objects 602 on two different phases. Secondly, the introduction of phase transition registers corrects the scheduled data path 600 so that the data arrives in synchronization when travelling between the regions having different clock phases.

By way of example, a transition between two regions 610-1, 610-2 with clock signals 180 degrees out of phase will cause the data crossing the boundary to advance by a half clock cycle with respect to other parallel branches of the data path 600 that remains in the same clock phase domain region.

The compiler is operable to ensure that all data inputs and outputs are in the same phase. Therefore all data must pass through an even number of clock phase transitions (i.e. boundaries between clock phase region domains), each of which that each offsets the data by half a clock cycle.

By ensuring that the data passes through an even number of transitions, the clock domain transitions can be addressed in by introducing a single, integer clock cycle delay as appropriate. Therefore, each single clock cycle delay compensates for two half clock cycle advances created by each clock phase transition. These registers introduced to compensate for the two half clock cycle advances are considered to have a latency of zero during rescheduling, so that the scheduler does not need to be aware of half-cycle paths.

In the simple case shown in FIG. 15, there is exactly one transition between two clock phases and no further attention is required to ensure a correctly functioning design. However, in more complex cases there can be multiple parallel paths, and in each parallel path any number of transitions between different clock phases, depending on the input design and the partitioning used.

Figures 16, 17:
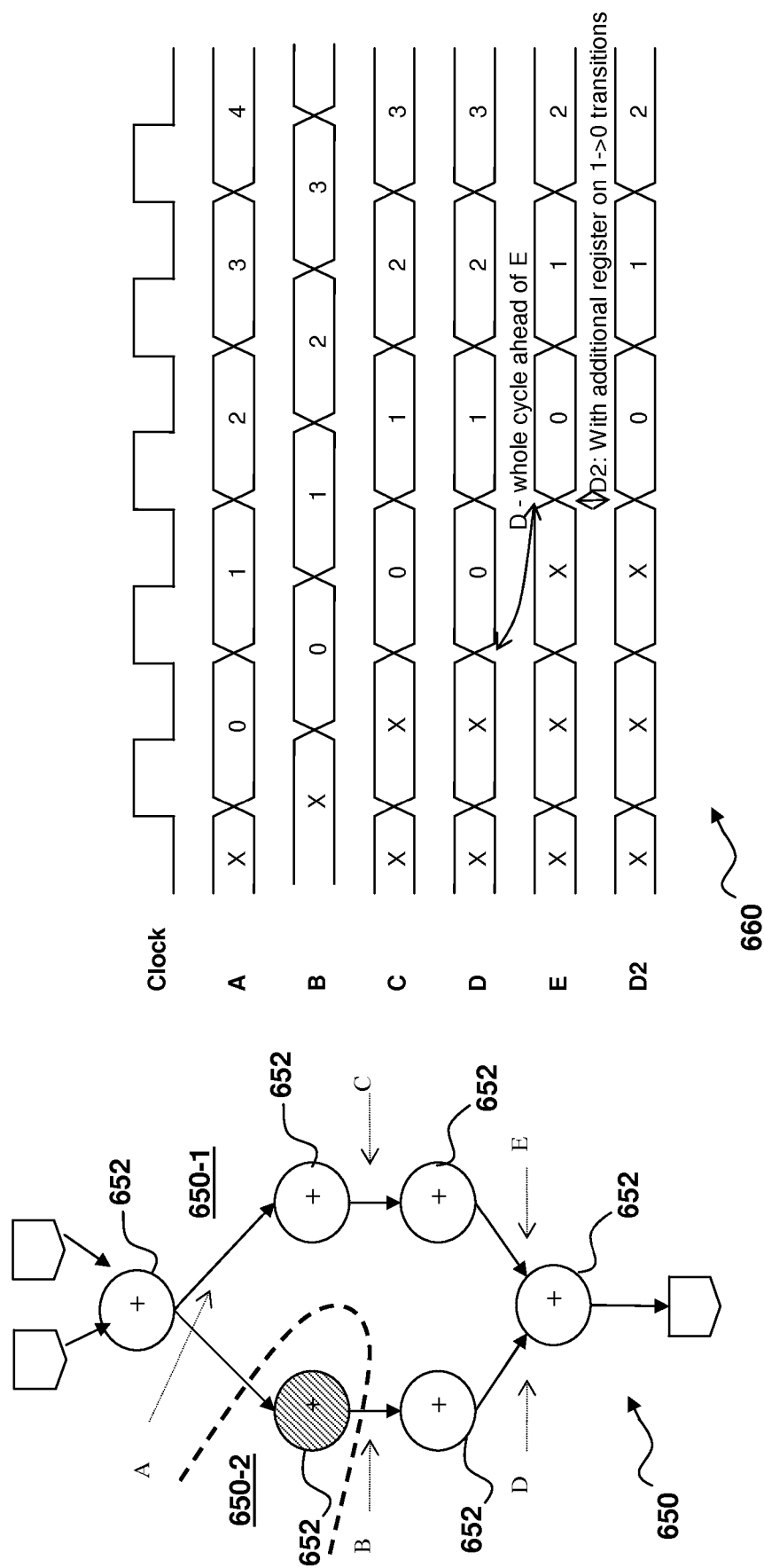
FIG. 16 shows a schematic diagram of a graph illustrating a data path partitioned into discrete clock phase domains.
FIG. 17 shows a timing diagram illustrating the state over time of labeled signals in the data paths of FIGS. 16 and 18.

FIG. 16 illustrates an alternative example of a data path 650. The data path 650 shows a more complex situation where data transitions in one parallel path along region 650-1 from logic elements in phase 0 to a logic element in region 650-2 (which is in phase 1) and then back to logic elements region 650-1 (i.e. in phase 0). In another parallel path of data path 650, the data remains in phase 0.

Timing diagram 660 shows the value of the corresponding signals over time at each stage of the data path 901. Sequential data items are labeled 0, 1, 2, 3, 4 to show the alignment of data at each stage of the pipeline. Logic elements running in region 650-1 (i.e. on phase 0) are sensitive to the rising edge of the clock, whereas logic elements running in region 650-2 (i.e. on phase 1) are sensitive to the falling edge of the clock. Logic elements 652 examine their input just prior to the respective clock edge and propagate an output result just after the respective clock edge. For simplicity, all logic elements shown have a latency of exactly one, so that the input sequence number propagates to the output every clock edge.

A data path is correctly synchronized if at each logic element, data on all inputs have the same sequence. For example, the timing diagram 660 shows that the input data to the arithmetic/logic element 652 comprising D and E, are exactly one cycle out of synchronization due to two phase transitions from phase 0 to phase 1 and then from phase 1 to phase 0 in one parallel path, compared to zero phase transitions in the other parallel path. At each transition between the two clock phases, the data advances by half a clock cycle, relative to data that remains in the same clock phase on other parallel paths. These advances are additive such that after two phase transitions, the data has advanced by an entire cycle.

Figure 18:
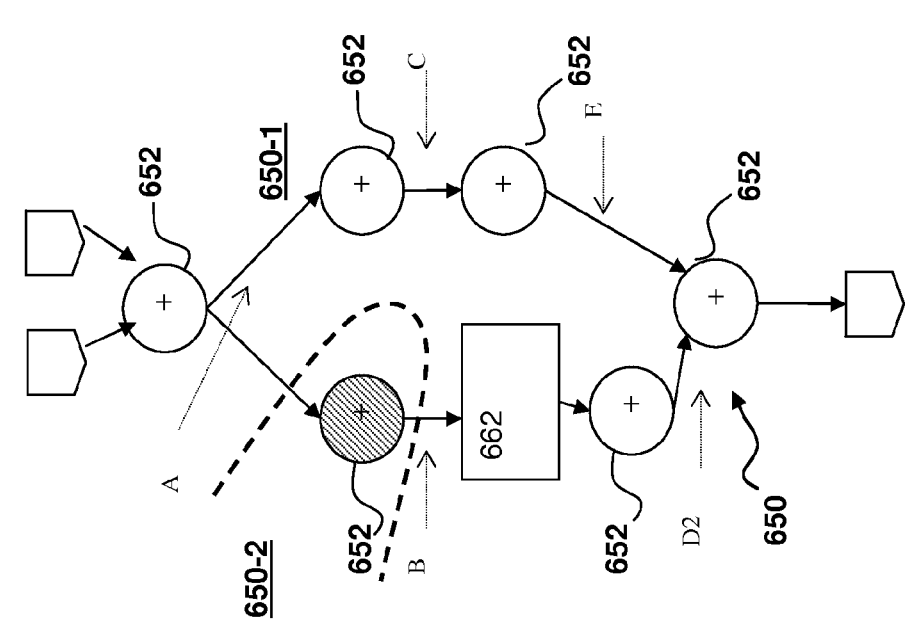
FIG. 18 shows a schematic diagram of a graph illustrating a data path partitioned into discrete clock domains and comprising a phase transition register to synchronize data across parallel paths with differing numbers of phase transitions.

In this embodiment, phase transition registers are inserted by the compiler to cancel out the effect of phase transitions. An example of this is shown in FIG. 18. Data path 650 of FIG. 18 is identical to data path 650 of FIG. 16 except for a phase transition register 662 which adds an additional cycle of delay to compensate for the two phase transitions. As can be seen from FIG. 17, the delayed signal D2 is now in correct alignment with E. By insertion of registers at the correct point, the compiler can realign the data.

In this embodiment, the number of phases is exactly two. This is advantageous in that each phase transition results in a ½ cycle advance. Therefore, any two phase transitions will advance the data by a whole cycle.

However, any suitable number of clock phases may be used on a kernel. Alternatives using any number (N) clock phases are possible where each transition advances the data by X/N of a cycle where X<N. For example with four clock phases each transition advances the data by ¼, ½ or ¾ of a cycle, depending on the starting and the finishing phase.

In this embodiment, the compiler (either at the high-level synthesis stage or at a lower level of abstraction) ensures that all input data starts in phase 0. In other words, all inputs are located within a single partitioned region. This enables a synchronized design to be achieved by simply inserting a phase transition register 612; 662 at each phase 1→0 transition. For example, given the example of FIG. 15 or 16, a phase transition register 612; 662 will be inserted every time a branch of a data path leaves respective region 610-2 or 650-2.

Since all data starts out in a single region 610-1; 660-1 (i.e. at phase 0), at every phase 1→0 transition there must have been both a 0→1 and 1→0 transition that causes exactly one cycle of advance and therefore one cycle of delay compensation.

In this embodiment, phase transition registers added to compensate for advance of data between phases have an advertised latency of zero. This enables a design to be rescheduled using a standard scheduler, for example using ILP (Integer Linear Programming) which does not need to model the ½ cycle advances occurring at transitions between clock phases. The register with an advertised latency of zero cancels out the two ½ cycle advances that are also invisible to the scheduler.

When partitioning a kernel into multiple clock phases, it is also important to ensure that the on-chip routing and logical paths between elements clocked on different phases are as short as possible. Logical and on-chip routing paths between the same clock phase have an entire clock cycle to propagate, whereas between phases there is only a fraction of the same clock cycle. A known method to help the timing of critical paths is to insert additional registers into the path.

In aspects of this embodiment utilizing high-level synthesis for the addition of phase transition registers, other phase transition registers can be added to ease timing closure for paths between clock phases, where data must propagate within a fraction of the whole cycle. Such registers do not compensate for phase transitions and therefore advertise a latency of one to the scheduler.

Step 506: Reschedule

In step 506, the scheduled data path 600 is rescheduled to address the additional delays introduced by the phase transition registers 612 inserted in step 504 and to ensure that the entire data path 600 is scheduled.

In an embodiment utilizing high level synthesis, rescheduling the design will cause the scheduler to compensate the additional whole cycle of delay by adding corresponding whole cycles to any parallel paths in the design. Rescheduling in this manner is only possible because the design is stored at a high level of abstraction. Inserting additional registers with an advertised latency of one cycle is not possible at a lower level of abstraction (for example, RTL) without breaking the functionality of the design.

Figure 20:
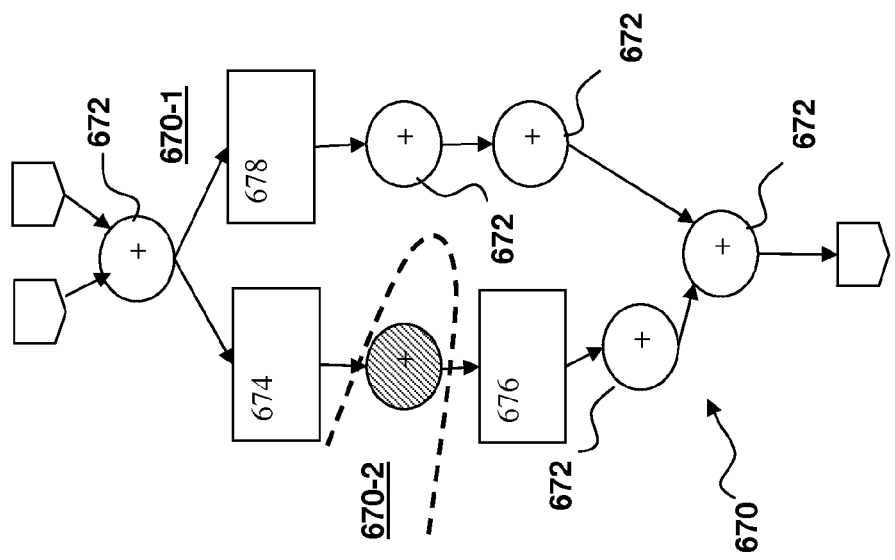
FIG. 20 shows a schematic diagram of a graph illustrating a data path partitioned into discrete clock domains including a phase transition register and an additional phase transition register similar to those shown in FIG. 19, together with an additional register added by a scheduler to compensate for the phase transition register in the other parallel path.
Figure 19:
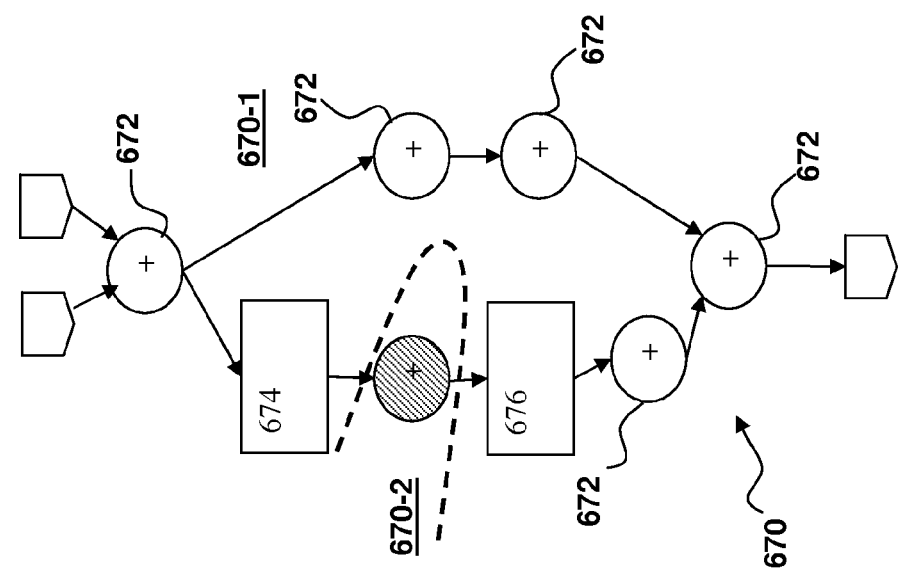
FIG. 19 shows a schematic diagram of a graph illustrating a data path partitioned into discrete clock domains and comprising a phase transition register similar to that of FIG. 18, and an additional phase transition register to ease timing across a half cycle path.

FIGS. 19 and 20 show further examples of phase transition register insertion and rescheduling. FIGS. 19 and 20 each show a data path 670 split into two regions 670-1, 670-2. Region 670-1 has phase 0 (and includes all the inputs) and region 670-2 has phase 1. Each data path 670 has nodes 672.

With reference to FIG. 19, phase transition register 674 is located at the phase 0→1 transition and phase transition register 676 at the 1→0 transition. Register 676 compensates for the two ½ cycle advances and so has a latency of 0 advertised to the scheduler. Register 674 is added to ease timing for the ½ cycle path and so advertises a latency of 1 to the scheduler. Once scheduled, the data path 670 of FIG. 19 becomes the data path 670 of FIG. 20.

The scheduler ignores register 676 because it has zero latency. However, register 674 has a non-zero latency and so the scheduler inserts register 678 in the other parallel branch to compensate for the additional cycle of delay caused by register 674.

However, if a lower-level approach is used, only phase transition registers with an advertised latency of zero are added by the compiler, to compensate for the sub-cycle advances created by clock phase transitions. This enables clock phase partitioning at any level of the design abstraction without any understanding of the high-level design, since the design does not need to be rescheduled.

Step 508: Group Units for Each Region

At step 508, the N+X schedule time for each object 602 is examined and objects 602 with the same N values are grouped. Note that N is a function of variables that may change at runtime.

Within each region 610-1, 610-2; 650-1, 650-2; 670-1, 670-2, for the respective replicated control state machine 608-1, 608-2, objects 602; 652; 672 with the same N value are then grouped to share the bulk of the control logic. Control logic will be shared across these nodes where the estimate for the cost of sharing (e.g. number of registers in the shift register) is lower than the estimate for the resource cost of generating additional control logic (e.g. the number of registers in a comparator).

Step 510: Generate Control Logic

At step 508, once the objects 602; 652; 672 are grouped as set out above, control logic can be implemented. Consider an example where three objects 602 are scheduled at cycles N+a, N+b and N+c within the same region 610-C. FIG. 12 shows an arrangement (in the context of the previous embodiment) whereby a comparator 112-1, 112-2, 112-3 is implemented for each respective cycle of the control logic element 608-C relating to region 610-C.

Various alternatives are available for the implementation of control logic, and this can be implemented automatically as required by the compiler. Alternatively, specific control logic can be implemented by the user as required. As set out above, this may be carried out during high-level synthesis or may be done at a lower (e.g. HDL or RTL level) of abstraction.

Step 512: Optimize Control Logic

Step 512 is, in one embodiment, optional. The method may proceed directly to step 514. If the high-level synthesis approach is used, in step 512, the compiler may optimize control logic as set out in step 408 described previously and as disclosed in FIG. 13. Thus, this approach to scheduling and design of control logic enables a trade-off to be achieved between logic used to recompute the enable signal and logic used to delay a previously computed enable signal.

The integration of data path scheduling and control logic implementation during high-level synthesis enables an optimum configuration of control logic for given hardware/performance requirements. The method then proceeds to step 514.

Step 514: Compile Graph

Once the optimized schedule and control logic arrangement has been determined, the graph can be compiled into a format such that the physical FPGA can then be formed. Compilers and compilation methods are well known in the art and the skilled person would be readily aware of software, hardware and implementations that could be used with the present disclosure. The method then proceeds to step 516.

Step 516: Produce FPGA Design

Once the graph has been compiled into the correct format in step 514, the FPGA design for the stream processor is formed. The FPGA design can then, optionally, be used to implement the optimized data paths (or kernels) and data flow in hardware. Once the FPGA design has been formed in hardware on an FPGA chip or device, it can be used as required by the end user to perform the stream calculations defined in step 202.

Figure 21:
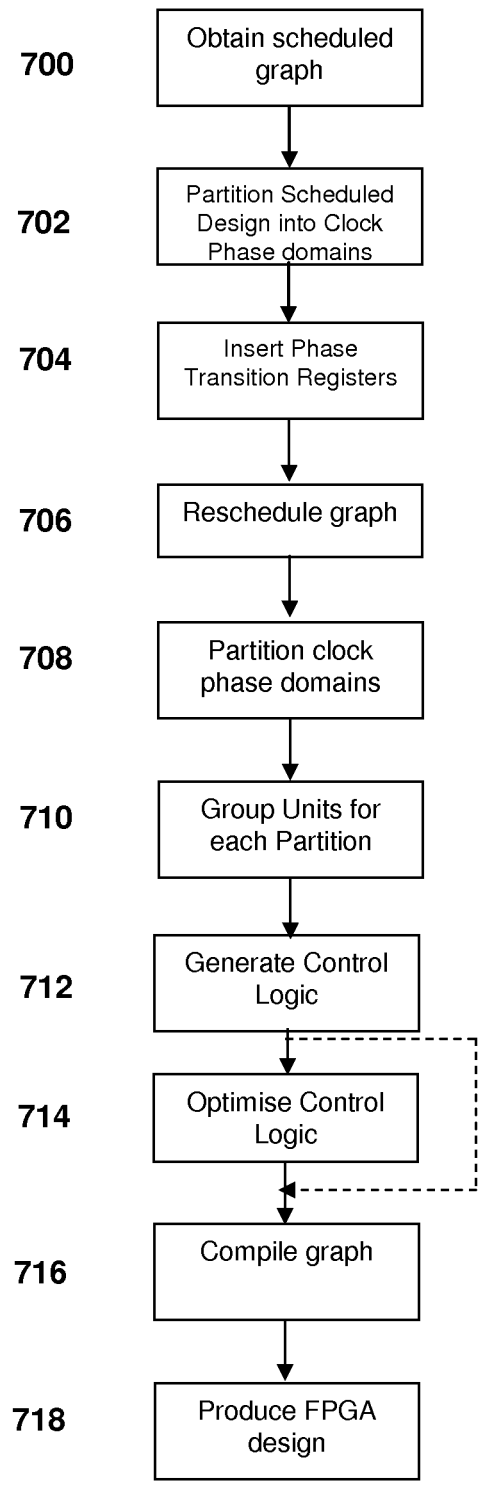
FIG. 21 shows a flow chart of a method of implementing control logic according to another aspect of the present disclosure.
Figure 22:
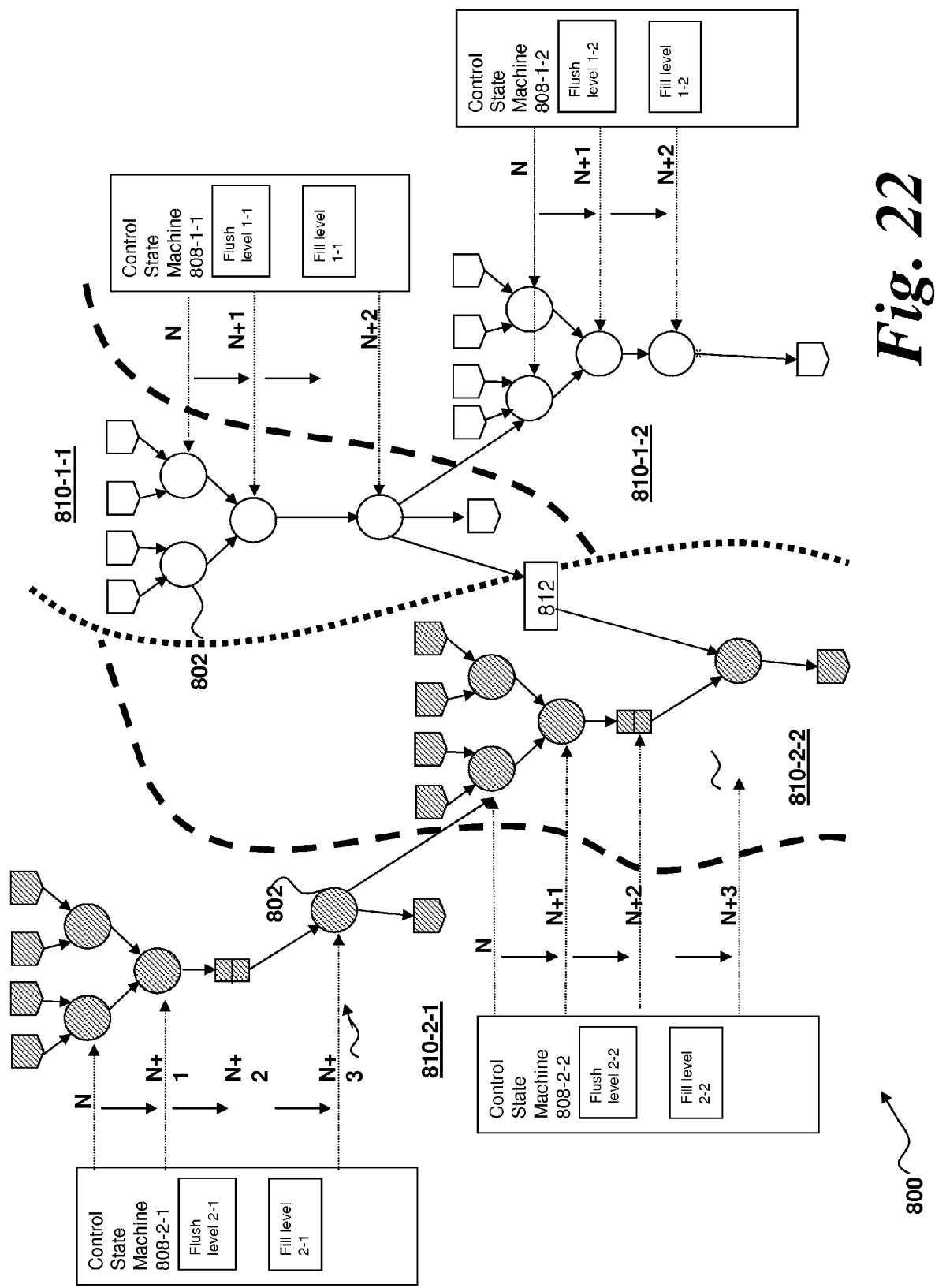
FIG. 22 shows a schematic diagram of a graph illustrating a data path partitioned into discrete clock domains and then further partitioned into discrete regions.

A Further Embodiment Of The present disclosure is shown in FIGS. 21 and 22. Steps 700-706 correspond to steps 500-506 described for the second embodiment and will not be described again here. However, this embodiment is applicable only to the implementation of steps 500 onwards utilizing a high-level synthesis approach.

Step 708: Partition Clock Phase Domains

At step 708, the clock phase domain regions defined in the second embodiment can be further sub-divided into smaller regions as set out in step 402 above in the context of the first embodiment.

In step 708, the compiler is operable to divide each clock phase domain region into control replication groups which subdivide the scheduled design further, so that each clock phase is further divided into smaller groups that will share replicated control logic.

Separate, or replicated, control logic can then be assigned to the arithmetic/logic objects 802 within each region. This assists in minimizing the fan-out of the control signals because each replicated control logic element has only to reach the arithmetic/logic objects 802 within each region rather than across the whole design.

In the example of FIG. 22, the data path 800 is divided into two clock phase domain regions 810-1 and 810-2, and each clock phase domain region 810-1, 810-2 is further subdivided into regions 810-1-1, 810-1-2, 810-2-1 and 810-2-2. Each region has appropriate control logic 808-1-1, 808-1-2, 808-2-1 and 808-2-2 assigned thereto. In this embodiment, the replicated part of the control state machine 808-1-1, 808-1-2, 808-2-1 and 808-2-2 corresponds to the fill/flush counters.

The replication of control logic minimizes the fan-out of enable signals to the objects 802.

In this embodiment, minimum-cut (or min-cut) partitioning is used to control the replication. It has been found that minimum-cut partitioning enables a useful compromise between fan-out of control signals and resource usage of replicated control logic.

The motivation for the min-cut partitioning is not to share circuits between unrelated functional objects 802. Unrelated functional objects 802 are those that are not already going to be implemented in nearby regions of a chip because of existing data-path connections. A part of the control state machine 808 (fill/flush counters, in this embodiment, although other parameters may be utilized) is replicated for each minimum-cut region, and share the result for all functional units 802 in that region.

Several algorithms exist to find minimum cuts and any suitable method may be utilized. For example, a simulated annealing algorithm may be used. The object of the algorithm is to find a nontrivial region of the graph such that the cut weight (i.e. the sum of the weights of the edges connecting the two regions) is a minimum. In the context of high-level stream processor design, each edge 806 has a "weight" which relates to the number of bits for the objects 802 that the particular edge 806 connects, for example.

The present disclosure uses min-cut theory to region the data path 800 into a plurality of cuts such that the weight of the cut is as small as possible.

While the example of FIG. 22 illustrates four regions in total (split over two different clock phase domain region) any number of regions 810-R may be specified within each clock phase domain region C (where R>1). The number of regions 810 into which the data path 100 is divided can be specified by the user and may take the form of, for example, a variable entered into the GUI 306 as described above.

Alternatively, the variable R could be specified automatically to give the best trade-off between hardware consumption and performance. R would, typically, be in the region of 2 to 128.

By specifying the number R of regions 810-R a particular data path 800 is divided into, a trade-off between the required amount of control logic 808-C-R (where C is the number of clock phase regions and R is the number of regions within a given clock phase domain region) and the timing performance of the resulting stream processor can be obtained.

Figure 23:
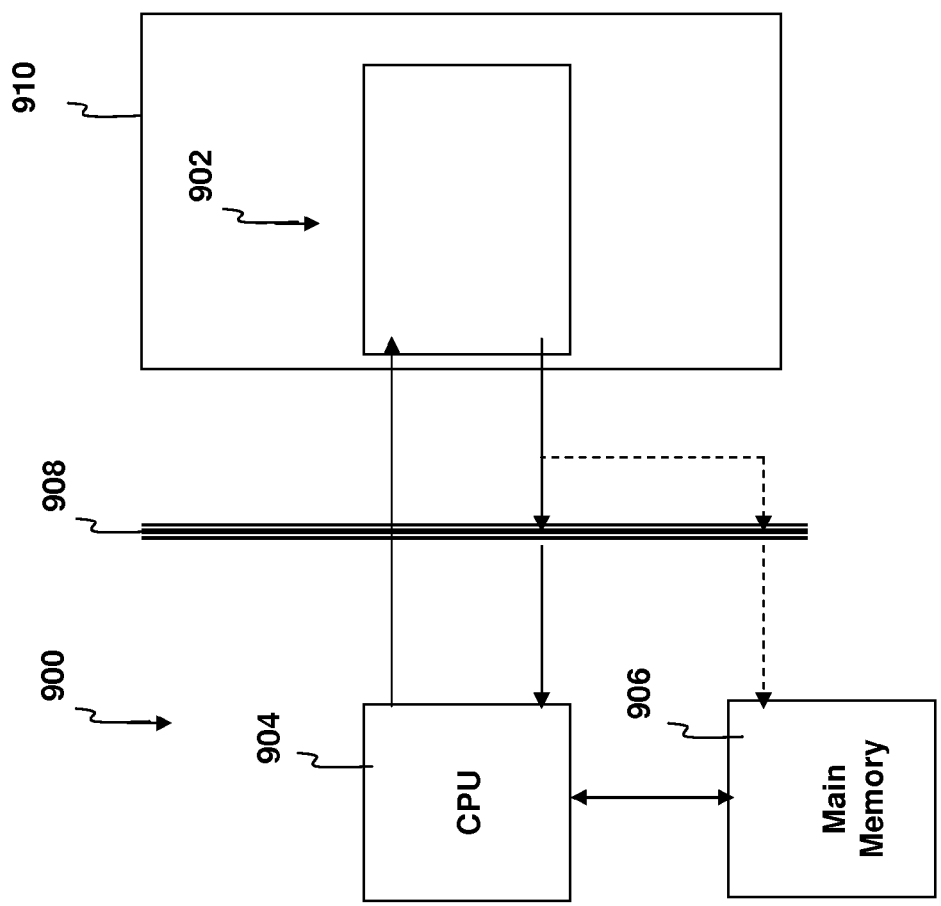
FIG. 23 shows a schematic diagram of a computer apparatus suitable for use with stream processing hardware produced using the method of the present disclosure.

FIG. 23 shows a schematic view of a computing device 900 with which an FPGA design 902 (including both a scheduled data path and accompanying optimized control logic) may be formed using the method of the present disclosure may be used. The computing device 900 comprises a Central Processing Unit (CPU) 904, a main memory 906 and a data bus 908.

The CPU 904 may take any suitable form and comprises a processor for carrying out the instructions of a computer program run on the computing device 900. The CPU 904 is the primary element carrying out the functions of the computing device 900 as is well known in the art. The CPU 904 is commonly located on a motherboard (not shown) which comprises the necessary contacts to supply the CPU 904 with power and to connect the CPU 904 to other components in the computing device 900.

The main memory 906 is associated with the CPU 904 and comprises an area of RAM. The RAM may take the form of SRAM, Dynamic RAM (DRAM) in which bits of data are stored as a charge in a capacitor or transistor gate, or any other suitable memory type. As is common for many computing applications, the main memory 906 may be provided as a plurality of SRAM or DRAM modules. These modules can quickly be replaced should they become damaged or when greater storage capacity is required. The main memory 906 is able to communicate with the CPU 904 via the motherboard forming part of the computing device 900.

The data bus 908 enables additional devices to be connected to the computing device 900 and to communicate with components of the computing device 900. The data bus 908 may take any suitable form, for example a Peripheral Component Interconnect Express (PCI-E) data bus. The data bus 908 acts as a motherboard-level interconnect to link motherboard-mounted peripherals and as an expansion card interface for add-in cards.

The FPGA 902 is located on, in this example, an accelerator card 910. The accelerator card 910 is configured to connect to the data bus 908 and may be, for example, a PCI-E format expansion board comprising interconnects suitable for connecting to a PCI-E data bus.

While, for clarity, only a single accelerator card 910 is included in the following example, it would be readily apparent to the skilled person that additional accelerator cards comprising FPGAs 902 formed according to the method of the present disclosure may be included to provide additional computational power. For example, four accelerator cards 910 may be included in parallel within one system, with each card communicating to the CPU 904 and to each other. Alternatively, multiple FPGA devices 902 may be provided on a single accelerator card 910.

Variations will be apparent to the skilled person. For example, while the herein-described examples relate to the generation of hardware designs for FPGA-based stream processors, the present disclosure is also applicable to the design of other programmable logic devices or Application Specific Integrated Circuits (ASICs). The skilled person would readily be aware of alternative devices which fall within the scope of the present embodiments.

In addition, while the above embodiments have been described with reference to minimum-cut partitioning, other partitioning approaches could be utilized with the described embodiments. While the minimum-cut provides for an efficient optimization of the partitioning, other methods can benefit from the optimization and partitioning of control logic at a high level of abstraction, i.e. at the HDL stage.

Therefore, alternative partitioning methods such as, for example, random or manually-directed partitioning could be used and which will benefit from the high-level partitioning of control logic as implemented by the present disclosure.

Embodiments of the present disclosure have been described with particular reference to the examples illustrated. While specific examples are shown in the drawings and are herein described in detail, it should be understood, however, that the drawings and detailed description are not intended to limit the disclosure to the particular form disclosed. It will be appreciated that variations and modifications may be made to the examples described within the scope of the present disclosure.

From the description provided herein, those skilled in the art are readily able to combine software created as described with appropriate general-purpose or special-purpose computer hardware to create a computer system and/or computer sub-components in accordance with the various embodiments, to create a computer system and/or computer sub-components for carrying out the methods of the various embodiments and/or to create a non-transitory computer-readable media (i.e., not a carrier wave) that stores a software program to implement the method aspects of the various embodiments.

The above discussion is meant to be illustrative of certain principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method for configuring a hardware design for a pipelined parallel stream processor, the method comprising:
    obtaining a scheduled graph representing a processing operation in a time domain as a function of clock cycles, the graph comprising at least one data path to be implemented in hardware as part of said stream processor and comprising at least one input, at least one output and a plurality of parallel branches configured to enable data values to be streamed therethrough from the at least one input to the at least one output as a function of increasing clock cycle;
    partitioning, on a computing device, said at least one data path into a plurality of discrete regions, each region operating on a different clock phase and having discrete control logic elements;
    inserting phase transition registers into said data path at a boundary between regions having different clock phases, said phase transition registers being operable to align data separated by a boundary between regions having different clock phases;
    utilizing, on a computing device, said graph and control logic elements to define a hardware design for implementation in hardware as said pipelined parallel stream processor.

2. The method according to claim 1, wherein a graph is partitioned into N regions and said phase transition registers are operable to compensate for X/N cycles of delay, where X is less than N, as a result of data transitioning between regions.

3. The method according to claim 1, wherein said step of partitioning is carried out such that all inputs are within the same region and operate on the same clock phase.

4. The method according to claim 1, wherein inserted phase transition registers have an advertised latency of zero.

5. The method according to claim 1, wherein the steps of obtaining, partitioning and inserting are carried out utilizing high level synthesis.

6. The method according to claim 5, wherein inserted phase transition registers have an advertised latency of 0 to L.

7. The method according to claim 5, wherein, subsequent to said step of inserting, the method further comprises:
    rescheduling said graph to account for said phase transition registers.

8. The method according to claim 5, wherein the or each data path is represented as comprising a plurality of functional objects each corresponding directly to a hardware element to be implemented in hardware as part of said pipelined parallel stream processor, each functional object being operable to execute a function on said data values propagating through said data path between the at least one input and the at least one output and being connected to other parts of said data path by one or more edge connections.

9. The method according to claim 8, wherein said step of partitioning comprises performing minimum-cut partitioning by:
    assigning a weight to each edge connection; and
    partitioning said data path such that a sum of weights of edge connections connecting said plurality of discrete regions is minimized.

10. The method according to claim 9, wherein the weight of each edge connection is dependent upon the number of bits of data required to be streamed therethrough per cycle.

11. The method according to claim 9, wherein said minimum-cut partitioning utilizes a simulated annealing algorithm.

12. The method according to claim 8, wherein said step of partitioning comprises performing minimum-cut partitioning by:
    assigning a weight to each functional object; and
    partitioning said data path such that a sum of weights of functional objects within each region is approximately evenly distributed.

13. The method according to claim 12, wherein the weight of each functional object is dependent upon a hardware utilization corresponding to said functional object.

14. The method according to claim 5, further comprising performing, on a computing device, partitioning of at least one of said discrete regions into a plurality of sub-divided regions such that each of said sub-divided regions operates on the same clock phase.

15. The method according to claim 14, wherein said partitioning into sub-divided regions comprises minimum-cut partitioning.

16. The method according to claim 5, further comprising:
    assigning, using high level synthesis, discrete control logic elements to each of said regions of said data path.

17. The method according to claim 16, wherein said step of assigning comprises, within one or more regions:
    grouping functional objects having a cycle position dependent upon common factors; and
    allocating common control logic to said groups of functional objects.

18. The method according to claim 17, wherein a, value of the common factors is specified after a resulting optimized hardware design has been implemented in hardware as said pipelined parallel stream processor.

19. The method according to claim 16, wherein each control logic element comprises control logic hardware units including a counter and one or more comparators, or a counter and one or more comparators and one or more shift registers having one or more delay elements.

20. The method according to claim 16, wherein said step of assigning further comprises, after said step of allocating:
    for each control logic element, automatically selecting a number of comparators, a number of shift registers, and a number of delay elements in each shift register.

21. The method according to claim 20, wherein said step of automatically selecting is done to minimize hardware requirements for each control logic element.

22. The method according to claim 1, wherein said step of partitioning further comprises selecting a number of discrete regions said data path is to be divided into.

23. The method according to claim 22, wherein the number of regions is in a of 2 to 4.

24. The method according to claim 1, wherein said step of obtaining comprises the steps of:
    defining, on a computing device, a processing operation designating processes to be implemented in hardware as part of said stream processor;
    defining, on a computing device, a graph representing said processing operation; and
    optimizing, on a computing device, the at least one data path in said graph to produce an optimized graph.

25. The method according to claim 1, wherein said stream processor is implemented on a Field Programmable Gate Array or an Application Specific Integrated Circuit.

26. The method according to claim 1, further comprising the step of forming said hardware design on said stream processor such that said stream processor is operable to perform said processing operation.

27. The method according to claim 1, further comprising:
programming a logic device to embody the generated design.

28. A non-transitory computer-readable medium having stored thereon a computer program executable by a programmable processing apparatus, comprising one or more software portions for performing the steps of claim 1.

29. A system for generating a hardware stream processor design, the system comprising:
a processor; and
a memory coupled to the processor and storing a program that, when executed by the processor, causes the processor to:
obtain a scheduled graph representing a processing operation in a time domain as a function of clock cycles, the graph comprising at least one data path to be implemented in hardware as part of a pipelined parallel stream processor and comprising at least one input, at least one output and a plurality of parallel branches configured to enable data values to be streamed therethrough from the at least one input to the at least one output as a function of increasing clock cycle;
partition, on a computing device, said at least one data path into a plurality of discrete regions, each region operating on a different clock phase and having discrete control logic elements;
insert phase transition registers into said data path at a boundary between regions having different clock phases, said phase transition registers being operable to align data separated by a boundary between regions having different clock phases;
utilize, on a computing device, said graph and control logic elements to define a hardware design for implementation in hardware as said pipelined parallel stream processor.

* * * * *